US006780950B2

(12) United States Patent
Cho et al.

(10) Patent No.: US 6,780,950 B2
(45) Date of Patent: Aug. 24, 2004

(54) PYRROLE COMPOUNDS, POLYMERS THEREOF AND EL ELEMENT USING THE SAME

(75) Inventors: Hyun-Nam Cho, Seoul (KR); Sung Hyun Jung, Seoul (KR); Sang Won Son, Jeollabuk-do (KR); Jae Hong Won, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 43 days.

(21) Appl. No.: 10/371,598

(22) Filed: Feb. 21, 2003

(65) Prior Publication Data

US 2004/0034189 A1 Feb. 19, 2004

(30) Foreign Application Priority Data

Aug. 12, 2002 (KR) .................................... 2002-0047559

(51) Int. Cl.$^7$ ............................................ C08F 126/06
(52) U.S. Cl. ...................... 526/258; 526/256; 526/257; 526/259; 526/260; 526/261; 526/265; 526/270
(58) Field of Search ................................ 526/256, 257, 526/258, 259, 260, 261, 265, 270

(56) References Cited

U.S. PATENT DOCUMENTS

| 4,401,545 A | * | 8/1983 | Naarmann et al. ........... 204/291 |
| 4,488,943 A | * | 12/1984 | Skotheim ...................... 205/91 |
| 4,694,062 A | | 9/1987 | Jenekhe et al. |
| 6,361,887 B1 | * | 3/2002 | Shi et al. ..................... 428/690 |

FOREIGN PATENT DOCUMENTS

| DE | 33 38 904 A1 | 5/1985 |
| EP | 0 340 826 A1 | 11/1989 |

OTHER PUBLICATIONS

Gabriele Grem, et al., Realization of a Blue–Light–Emitting Device Using Poly(P–phenylene), Adv. Mater. 4(1992) No. 1, pp. 36–37.
James M. Tour, "Aoluble Oligo–and Polyphenylenes", Adv. Mater. 1994, 6, No. 3, pp. 190–198.
Arno Kraft, et al., "Electrolumnescent Conjugated Polymers–Seeing Polymers in a New Light", Angew. Chem. Int. Ed. 1998, 37, 402–408.
R.H. Friend, et al., "Electroluminescence in conjugated polymers", Nature, vol. 397, Jan. 14, 1999, pp121–128.
D.Y. Kim et al., "Blue light emitting polymers", Progress in Polymer Science, 25 (2000) 1089–1139.
Mark. T. Bernius, et al., "Progress with Light–Emitting Polymers" Adv. Mater. 2000, 12, No. 23, Dec. 1, 1737–1750.
C. Zhang, et al., Blue electroluminescent diodes utilizing blends of poly (p–phenylphenylene vinylene) in poly (9–vinylcarbazole)., Synthetic Metals, 62 (1994) 35–40.

M.R. Andersson, et al., "Electroluminescence from Substituted Poly(thiophenes): From Blue to Near–Infrared", Macromolecules 1995, 28, 7525–7529.
Hubert Spreitzer, et al., "Soluble Phenyl–Substituted PPVs–New Materials for Highly Efficient Polymer LEDs", Adv. Mater., 1998, 10, No. 16, pp. 1340–1343.
Hyun Nam Cho et al., "Blue and Green Light Emission from New Soluble Alternating Copolymers", Adv. Mater., 1997, 9, No. 4, 326–328.
Gerrit Klarner, et al., "Communications", Adv. Mater. 1998, 10, No. 13, 993–997.
H.N. Cho, et al., "Statistical Copolymers for Blue–Light–Emitting Diodes", Macromolecules, 1999, 32, 1476–1481.
Michael Inbasekaran, et al., "Fluorene homopolymers and copolymers", Synthetic Metals, 111–112 (2000) 397–401.
I. Levesque, et al., "Organic tunable electroluminescent diodes from polyfluorene derivatives", Synthetic Metals, 122, (2000) 79–81.
M. Moroni, et al., "Rigid Rod Conjugated Polymers for Nonlinear Optics. 1. Characterization and Linear Optical Properties of Poly(aryleneethynylene) Derivatives", Macromolecules 1994, 27, 562–571.
Andrew P. Davey, et al., "New Rigid Backbone Conjugated Organic Polymers with Large Fluorescence Quantum Yields", J. Chem. soc., Chem. Commun., 1995, 1433–1434.
Christoph Weder, et al., "Efficient Solid–State Photoluminescence in New Poly(2,5–dialkoxy–p–phenyleneethynylene)s", Macromolecules, 1996, 20, 5157–5165.
J.M. Hong et al., "Synthesis and Luminescence Studies of Poly (fluorenylene ethynylene)s", Synthetic Metals, 102 (1999) 933–934.
Christoph Weder, et al., "Incorporation of Photoluminescent Polarizes into Liquid Crystal Displays", Science, Feb. 1998, vol. 279, 835–837.
Kevin A. Bunten, et al., "Synthesis, Optical Absorption, Fluorescence, Quantum Efficiency, and Electrical Conductivity Studies of Pyridine/Pyridinium Dialkynyl Organic and Pt(II)–o–Acetylide Monomers and Polymers", Macromolecules, 1996, 29, 2885–2893.
H.N. Cho, et al., "Synthesis and luminescent characteristics of fluorene–based polymers containing diacetylene unit", Synthetic Metals, 111–112 (2000), 429–431.
J.B. Kim, et al., "Novel fluorene–based polymers containing acetylene units", Synthetic Metals 119 (2001) 105–106.
C.W. Tang et al., "Organic electroluminescent diodes", Appl. Phys. Lett. 51(12), Sep. 21, 1987, 913–915.

(List continued on next page.)

*Primary Examiner*—Helen L. Pezzuto
(74) *Attorney, Agent, or Firm*—Darby & Darby

(57) ABSTRACT

A pyrrole compound, polymers thereof and EL element using the same are disclosed. The pyrrole compound and polymers thereof can be used as a material for an organic and polymeric electroluminescence element and/or other optical devices such as an optical switch, sensor, module, waveguide, transistor, laser, light-absorbing body, dielectric substance, membrane and the like.

6 Claims, 3 Drawing Sheets

OTHER PUBLICATIONS

Figure 1:
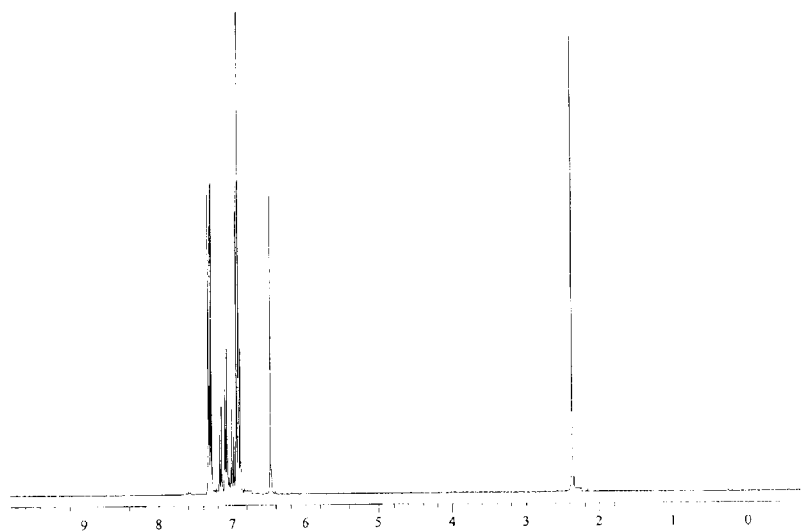

Noboru Mizushima, et al., "A protein conjugation system essential for autophagy", Nature, vol. 395, Sep. 24, 1998, 395–398.

A.C. Brown, et al., "Tropospheric lifetimes of three compounds for possible replacement of CFC and halons", Nature, vol. 347, Oct. 11, 1990, 541–540.

Katsumi Yoshino, et al., "Gel chromism and anomalous luminescence in poly(3-alkylthiophene)" Synthetic Metals, (1992) 491–497.

M.A. Baldo, et al., "High efficiency fluorescent organic light–emitting devices using a phosphorescent sensitizer", Nature, vol. 403, Feb. 17, 2000, 750–753.

Markus Gross, et al., "Improvins the performance of doped TT–conjugated polymers for use in organic light–emitting diodes", Nature, vol. 405, Jun. 8, 2000, 661–664.

Michael A. Ogliaruso, et al., Chemical Reviews, vol. 65, No. 3, May 25, 1965, Chemistry of Cyclopentadienones, pp. 261–367.

* cited by examiner

PYRROLE COMPOUNDS, POLYMERS THEREOF AND EL ELEMENT USING THE SAME

BACKGROUND OF THE INVENTION

1. Field of the Invention

The present invention relates to pyrrole compounds, polymers thereof which can be used as a material for an organic polymer semiconductor and optical electronic material, and in particular, as a core material for an organic and polymeric electroluminescence (referred to as "EL", hereinafter) element, and to an EL element using the same.

2. Description of the Background Art

Poly(phenylenevinylene) (referred to as "PPV", hereinafter), polythiophene (referred to as "PTh", hereinafter) and polyphenylene group polymers (d 2F Nature, 4 7, p549 (1990), Synth. Met., 50(1–3), p491 (1992); Adv. Mater., 4, p36 (1992); Adv. Mater., 6, p190 (1994); and Chem. Rev., 99, p1747 (1999)) have been widely and representatively known as organic polymer semiconductor and optical electronic materials (See Semiconducting Polymers: Chemistry, Physics and Engineering, Edited by G. Hadziioannou and P. F. van Hutten, WILEY-VCH (2000)) or as polymer light-emitting materials (Angew, Chem, Int. Ed., 37, p402 (1998); Nature, 397, p121 (1999); Prog. Polym. Sci., 25, p1089 (2000); and Adv. Mater., 12, p1737 (2000)). However, such polymer materials in which researches have been conducted into up to now have shortcomings that final products are not dissolved in an organic solvent.

There have been known PPV or PTh derivatives which emit lights of blue, green and red, and have an improved processibility by introducing a suitable substituent thereto (Synth. Met., 62, p35 (1994); Adv. Mater., 4, p36 (1992); and Macromolecules, 28, p7525 (1995)), and some of which exhibit an excellent processibility since they can be easily dissolved in an organic solvent even though they have a large molecular weight (Adv. Mater., 10, p1340 (1998)).

Recently, fluorene group polymers have been reported frequently as light-emitting materials (See Jpn. J. Appl. Phys., 30, pL1941 (1991); J. Polym. Sci. Polym. Chem. Ed., 31, p2465 (1993); J. Am. Chem. Soc., 118, 7416 (1996); Adv. Mater., 9, p326 (1997); Adv. Mater., 10, p993 (1998); Macromolecules, 32, p1476 (1999); Nature, 405, p661 (2000); Synth. Met., 111–112, p397 (2000); Synth. Met., 122, p79 (2001) and J. Am. Chem. Soc., 123, 946 (2001)).

In addition, there are U.S. Pat. Nos. 5,621,131, 5,708,130 and 5,900,327 which disclose fluorene group polymers having a single bond, and U.S. Pat. No. 5,807,974 which discloses a fluorene group alternate copolymer having a conjugate double bond as a light-emitting material for an EL element.

Polymers having an acetylene group have been presented as an organic polymer semiconductor and optical electronic material (See Makromol. Chem., 191, p857 (1990); Macromolecules, 27, p562 (1994); J. Chem. Soc., Chem. Commun., p1433 (1995); and Macromolecules, 29, p5157 (1996)), which mostly relate to a nonlinear optical material, a photoconductivity and photoluminescence (hereinafter referred to as "PL") material. Among them, Synth. Met., 102, p933 (1999) discloses an example used as an EL material, and researches into other applications have been also reported (See Science, 297, p835 (1998)). Polymers having a diacetylene group have been also reported (See Prog. Polym. Sci., 20, p943 (1995); CHEMTECH, October P32 (1993); Macromolecules, 29, p2885 (1996); Synth. Met., 111–112, p429 (2000); and Synth. Met., 119, p105 (2001)). These polymers are so sensitive to heat or light, like the above acetylene group polymers, that they can be easily cross-linked, so as to enable to obtain stable cross-linked polymers. Applications of polymers having an acetylene or diacetylene group as EL materials have been patented to the applicant of the present invention (U.S. Pat. Nos. 5,876,864 and 6,344,286).

However, until now, organic light-emitting diodes using organic complex such as Alq3 or Ir(Ppy)3, rather than polymers, have been commercialized as organic EL materials (U.S. Pat. Nos. 4,356, 429 and 5,061,569; Appl. Phys. Lett., 51, p913 (1987); SID Digest, 27, p849 (1996); Nature, 395, p161 (1998); and Nature, 403, p750 (2000)).

There have not been reported any blue light emitting polymers, including a fluorene group polymer, which shows good enough performances in efficiency and life of element to be commercialized, except for some green and orange color emitting PPV group polymers exhibiting excellent characteristics (Adv. Mater., 10, p1340 (1998)). Therefore, it is still expected a novel organic and polymer EL material, which can ensure highest efficiency and maximize stable life of an element, to be presented.

Polyaniline, polypyrrole and derivatives thereof which have been known as conducting materials (Handbook of Conducting Polymers, Edited by T. A. Skotheim, Marcel Dekker (1986)) are only subjected to researches for using antistatic, electrode and chromic materials, and their applications as light emitting materials can be rarely found.

SUMMARY OF THE INVENTION

Therefore, an object of the present invention is to provide novel pyrrole compounds and polymers thereof, in which their structure can be identified, and which can be well dissolved in an organic solvent and can be applied as EL and other optical electronic materials.

Another object of the present invention is to provide an EL element using the above pyrrole compounds and/or polymers thereof as a core material.

The foregoing and other features, aspects and advantages of the present invention will become more apparent from the following detailed description of the present invention when taken in conjunction with the accompanying drawings.

DETAILED DESCRIPTION OF THE INVENTION

A pyrrole compound and polymers thereof according to the present invention are represented by the following chemical formula (1):

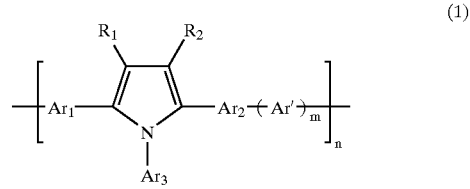

(1)

wherein, m is 0 or an integer of above 1, and n is an integer of above 1;

$R_1$ and $R_2$ are substituents which are the same with or different from each other, and includes hydrogen, $C_1$–$C_{22}$ aliphatic alkyl, $C_1$–$C_{22}$ alicyclic alkyl, $C_1$–$C_{22}$ acyl and $C_1$–$C_{22}$ alkoxy, $C_6$–$C_{30}$ aryl or aryloxy, a halogen containing substituent, silicon containing substituents, organic acid and ester of organic acid, but not limited thereto, and in more detail, $R_1$ and $R_2$ can be independently selected from the group consisting of hydrogen, methyl, ethyl, propyl, isopropyl, butyl, isobutyl, pentyl, hexyl, ethylhexyl, heptyl, octyl, isooctyl, nonyl, decyl, dodecyl, hexadecyl, octadecyl, docodecyl, cyclopropyl, cyclopentyl, cyclohexyl, acetyl, octanoyl, benzoyl, methoxy, ethoxy, etylenedioxy, buthoxy, hexyloxy, methoxyethoxyethyl, methoxyethoxyethoxyethyl, cyanoethyl, carboxymethyl, phenyl, phenoxy, tolyl, benzyl, naphthyl, anthracenyl, terphenyl, pyrenyl, diphenylanthracenyl, pentacenyl and derivatives thereof, chloride, bromide, iodide, bromomethyl, trimethylsilyl, dimethyloctylsilyl, and butylsulfonic acid, propionic acid and methyl esters thereof;

$Ar_1$, $Ar_2$ and $Ar_3$ are the same or different aromatic group, respectively selected from the group consisting of $C_6$–$C_{30}$ aromatic group, or halogen, metal or hetero atom-containing $C_6$–$C_{30}$ aryl group, and examples include phenyl, tolyl, naphthyl, stilbenyl, fluorenyl, anthracenyl, terphenyl, pyrenyl, diphenylanthracenyl, dinaphthylanthracenyl, pentacenyl and derivatives thereof, bromophenyl, hydroxyphenyl, thienyl, pyridyl, azobenzenyl, ferrocenyl, carbazoyl, porphyrinyl and derivatives thereof; and Ar' is an aromatic or heterocyclic group such as phenyl, naphthyl, anthracenyl, fluorenyl, thiopenyl, pyrrolyl, pyridinyl, aryloxadiazolyl, triazolyl, carbazolyl, arylamino, arylsilano or derivatives thereof, but not limited thereto, and especially preferable examples include the groups represented by the following chemical formulae:

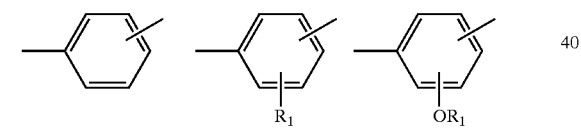
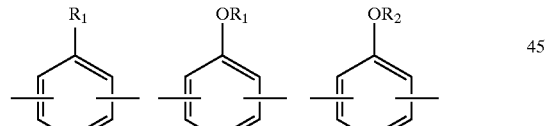
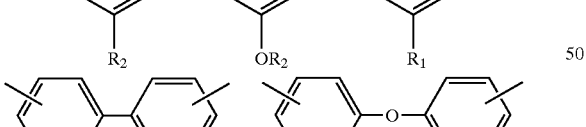
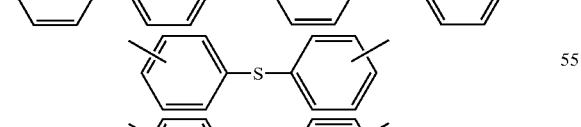
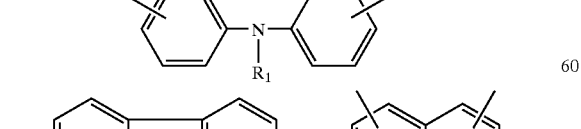
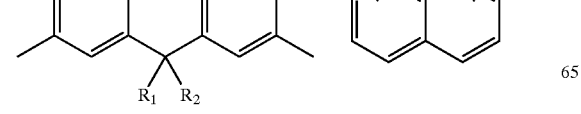

-continued

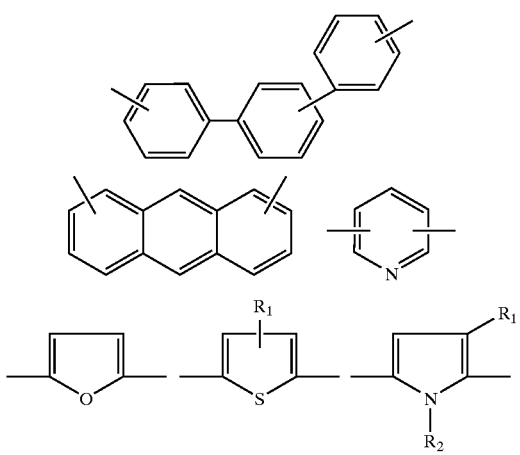
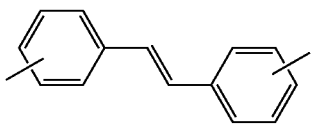
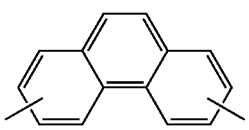
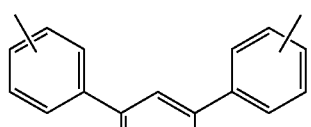
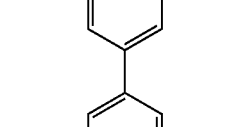
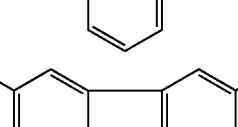
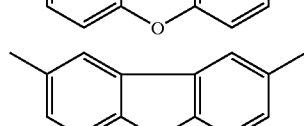
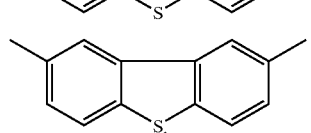
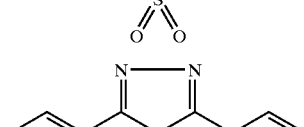
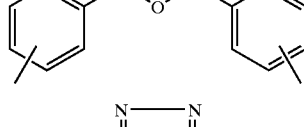
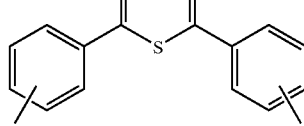

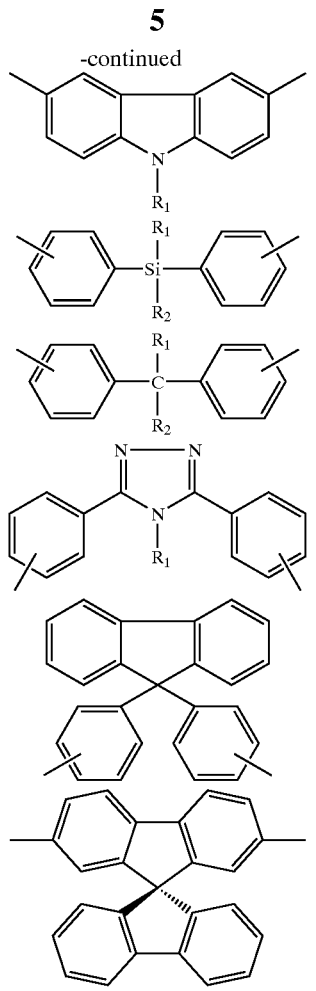

wherein, R1 and R2 are the same substituents as described in the above chemical formula (1).

The pyrrole compounds and polymers thereof of the present invention include a reaction or polymerization product between the same or different pyrrole compounds of the present invention, and a reaction or polymerization product between the pyrrole compounds of the present invention and other organic compound. The kinds of the compounds and polymers thereof of the present invention are not specially limited, and any pyrrole compounds and polymers thereof are included so long as it can be easily prepared and have excellent EL properties.

The pyrrole compounds and polymers thereof according to the present invention can be prepared through the following reaction schemes 1 to 14:

Reaction Scheme 1:

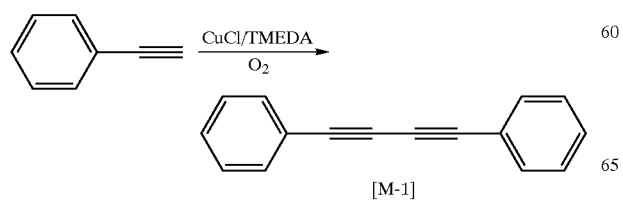

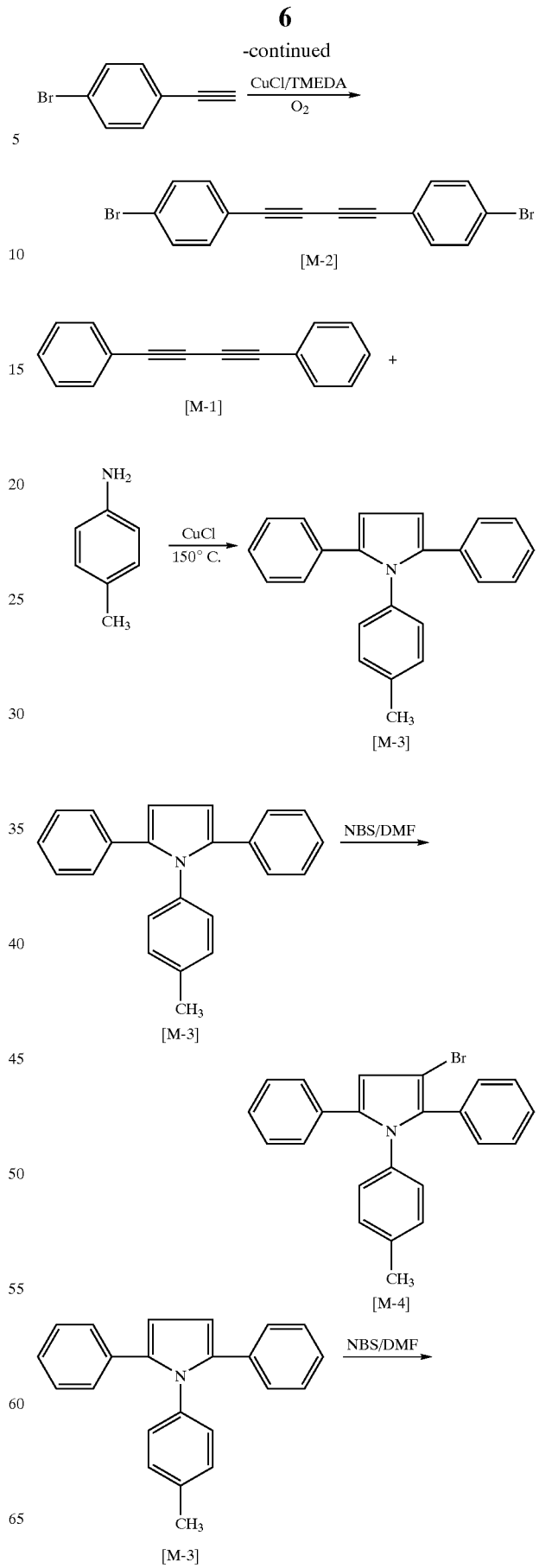

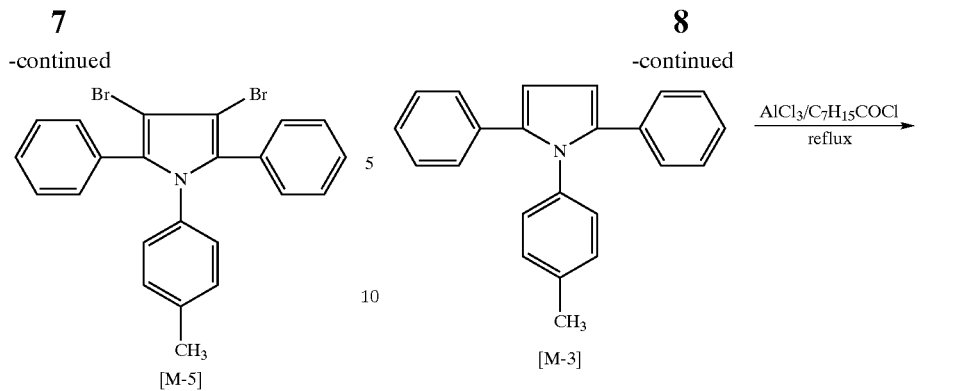
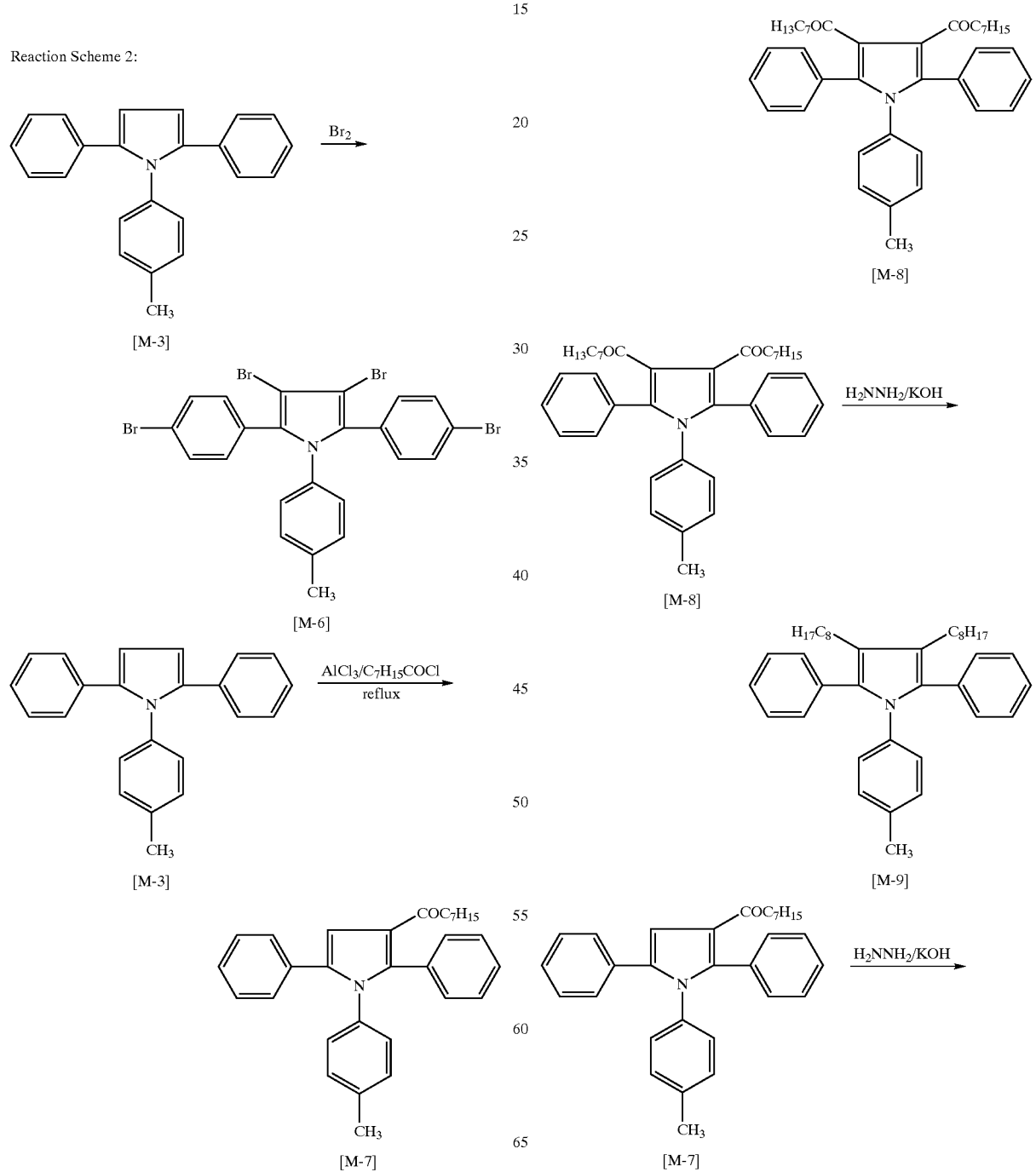
Reaction Scheme 2:

-continued
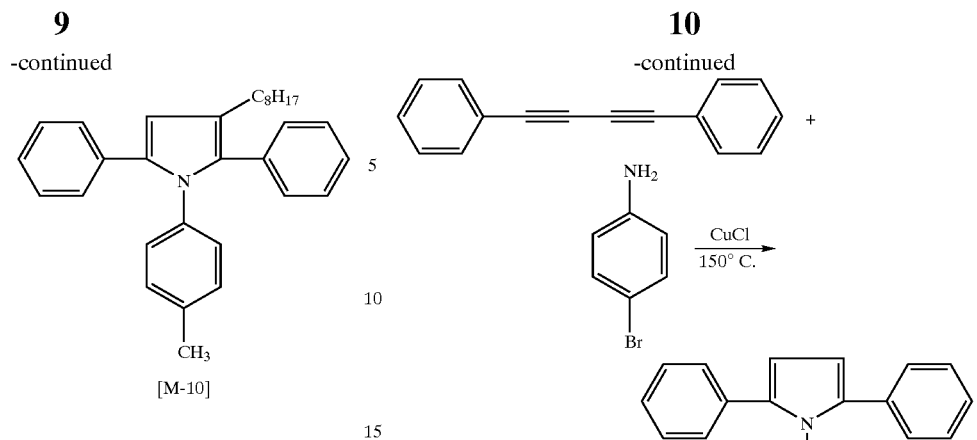
Reaction Scheme 3:
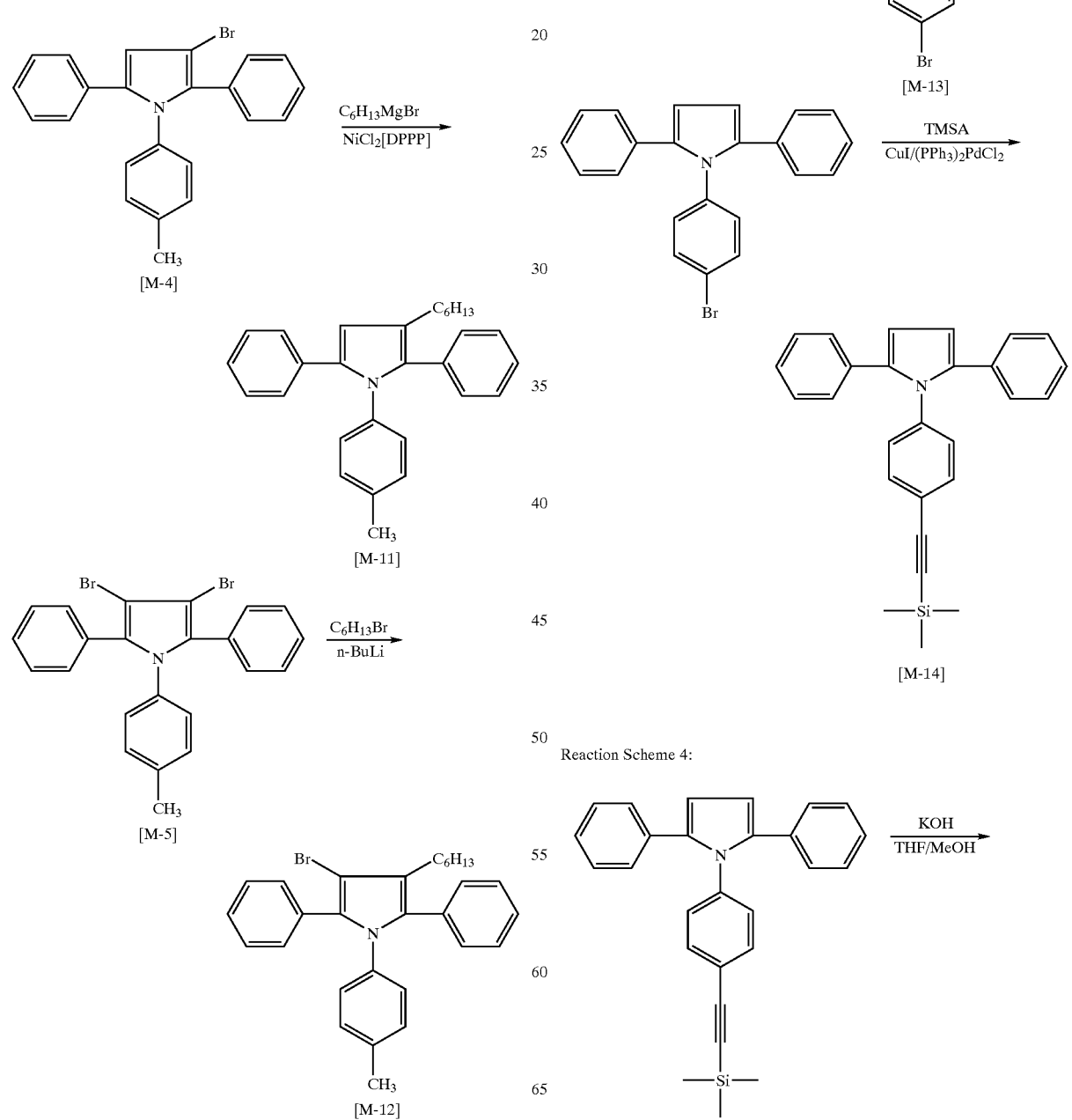

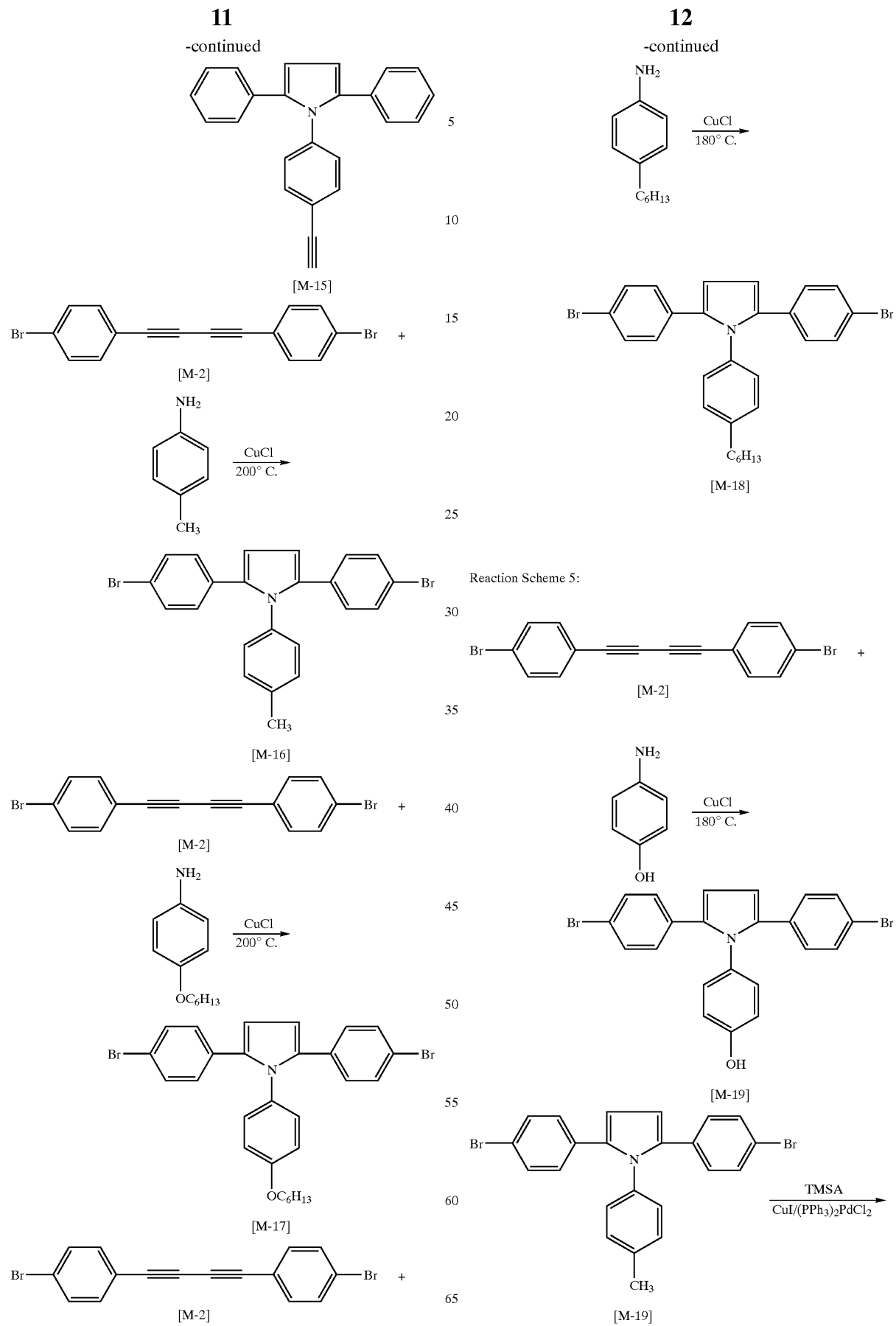

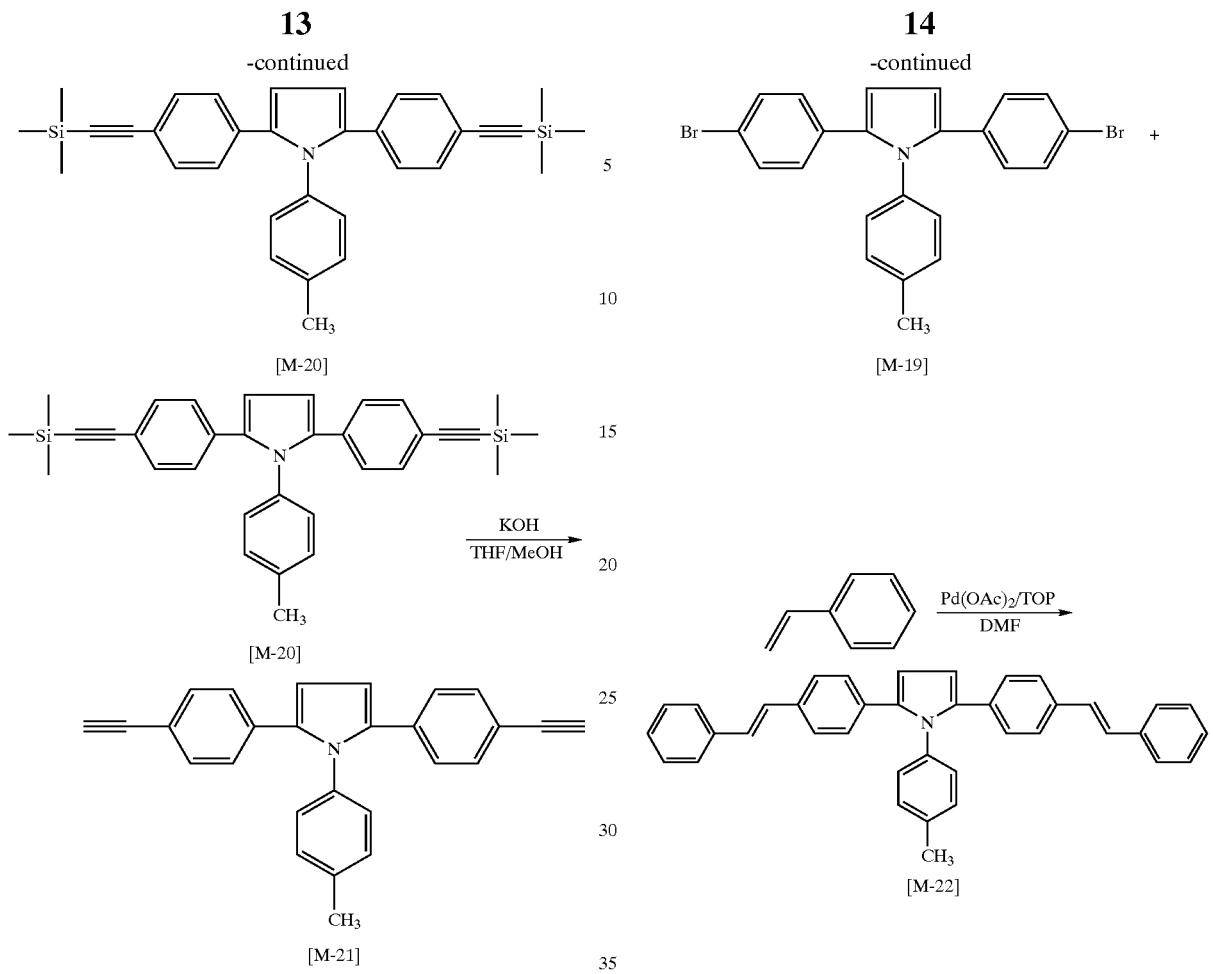
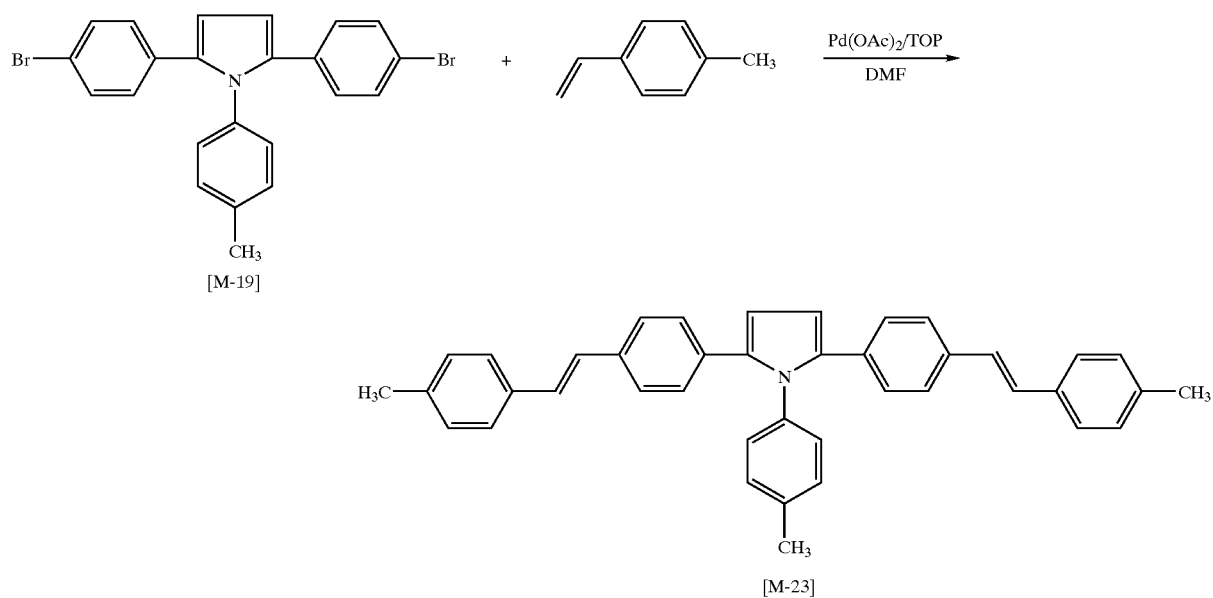

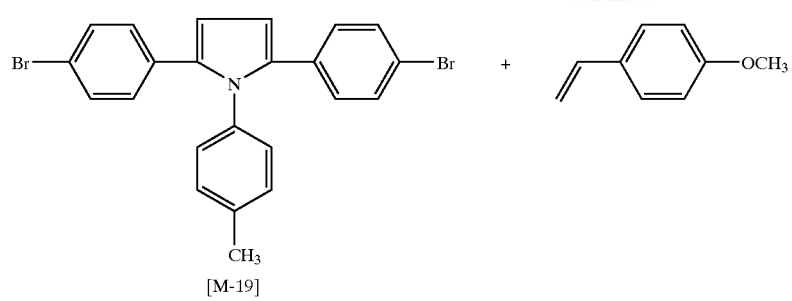
-continued
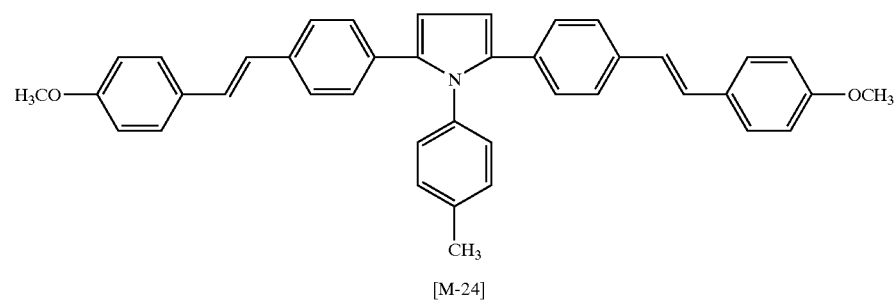
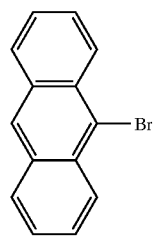 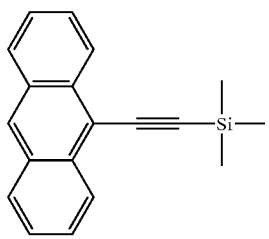 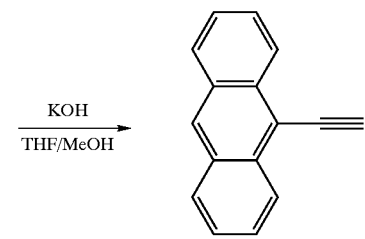
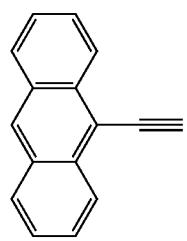 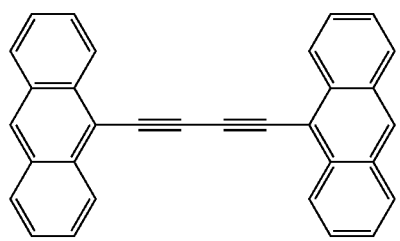

Reaction Scheme 7:
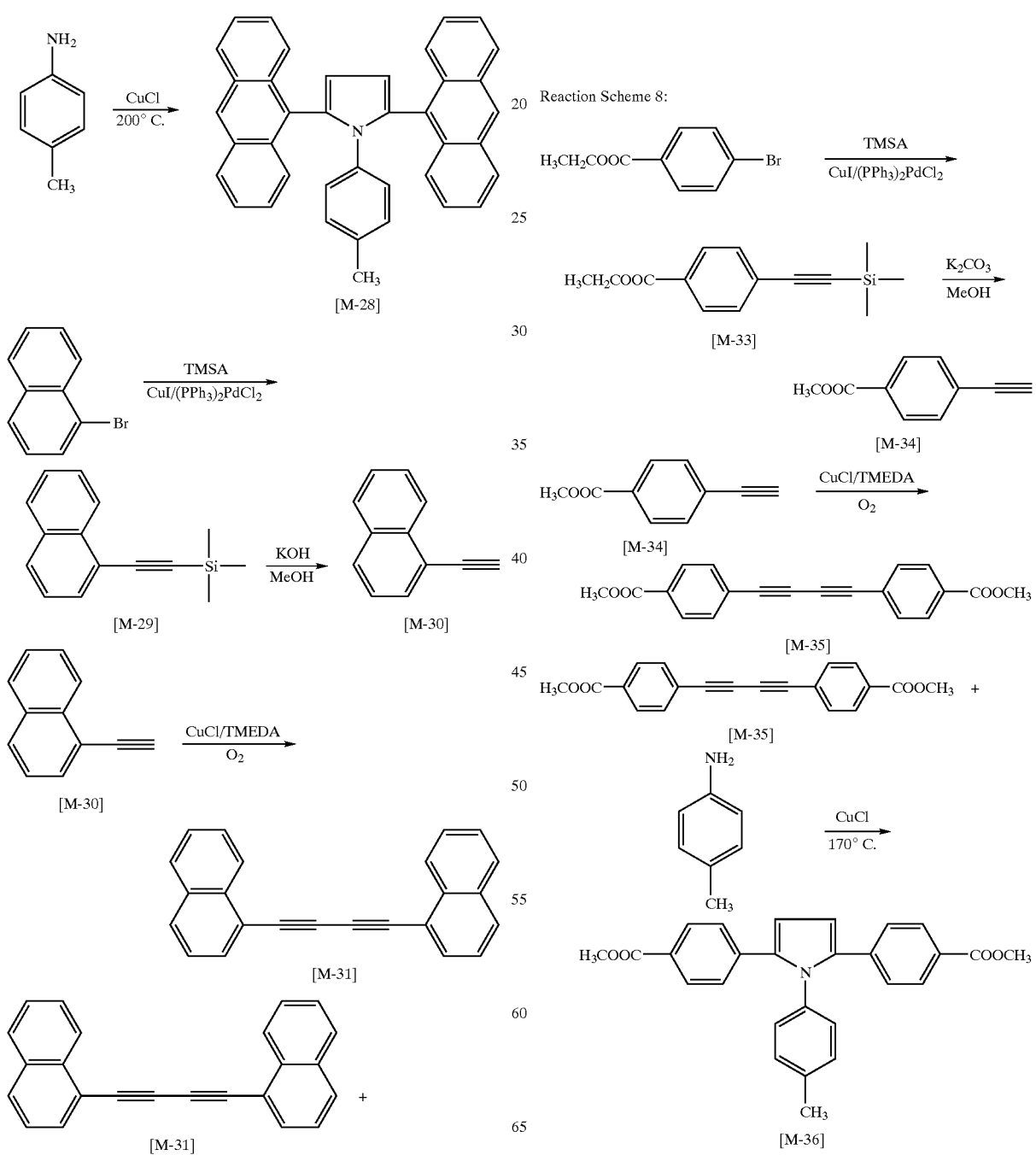
Reaction Scheme 8:
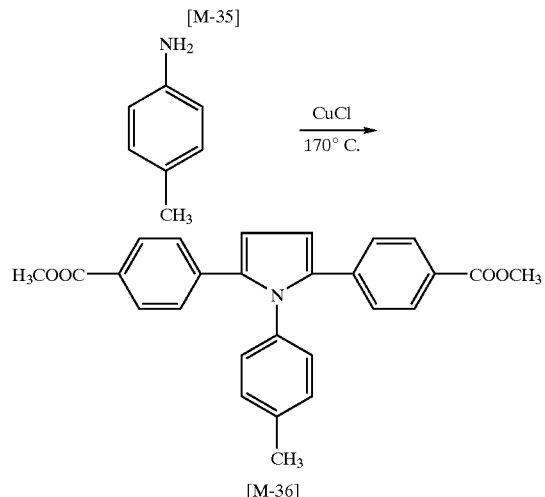

-continued
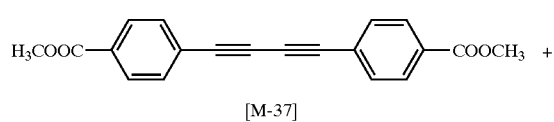
[M-37] +
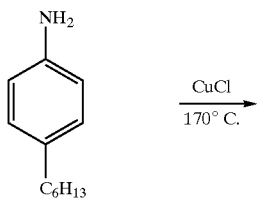
→ CuCl, 170° C.
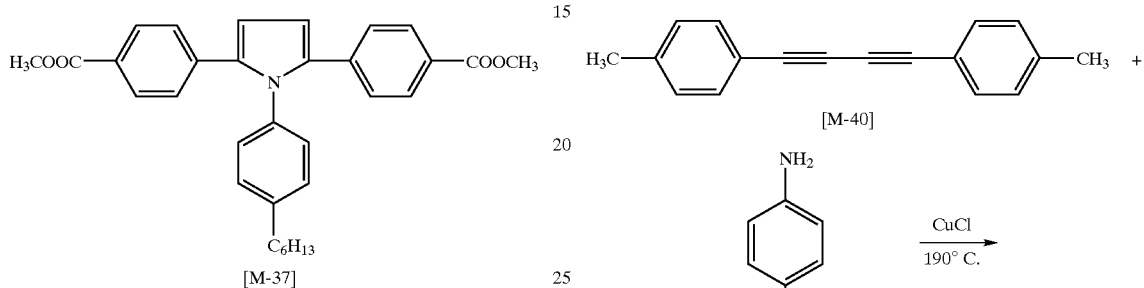
[M-37]
Reaction Scheme 9:
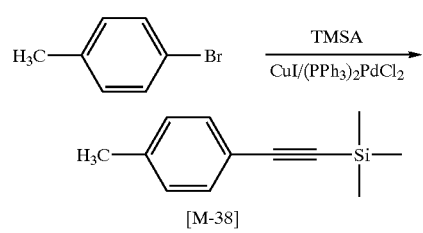
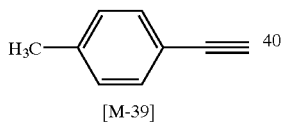
[M-39]
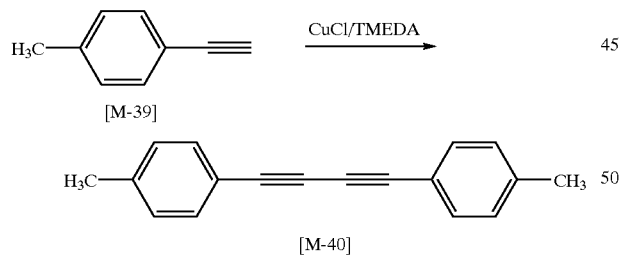
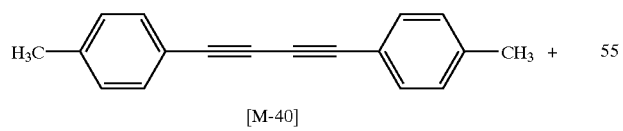
[M-40] +
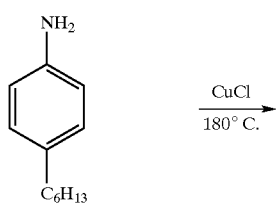
→ CuCl, 180° C.
-continued
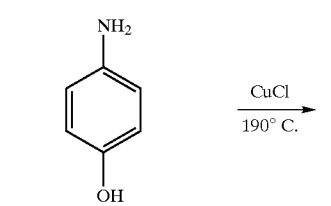
[M-41]
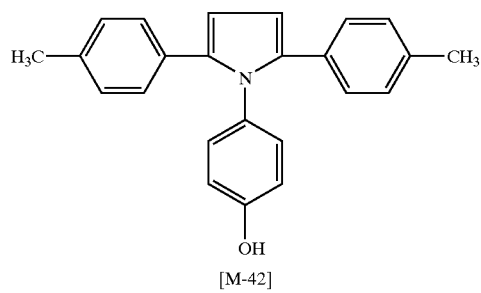
[M-40] +
(NH₂-phenol) → CuCl, 190° C.
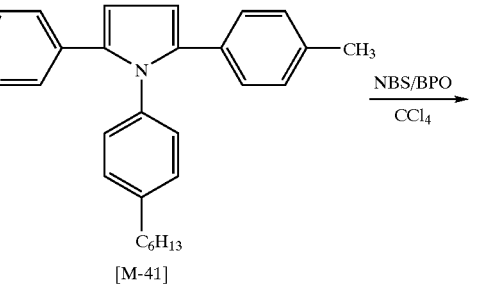
[M-42]
Reaction Scheme 10:
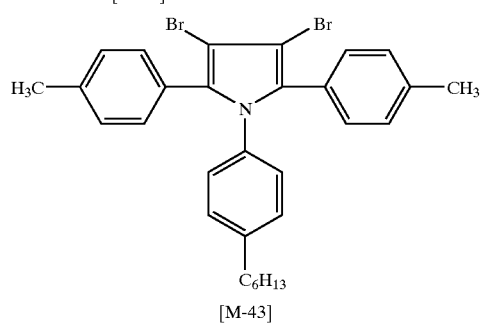
[M-41]
→ NBS/BPO, CCl₄
[M-43]

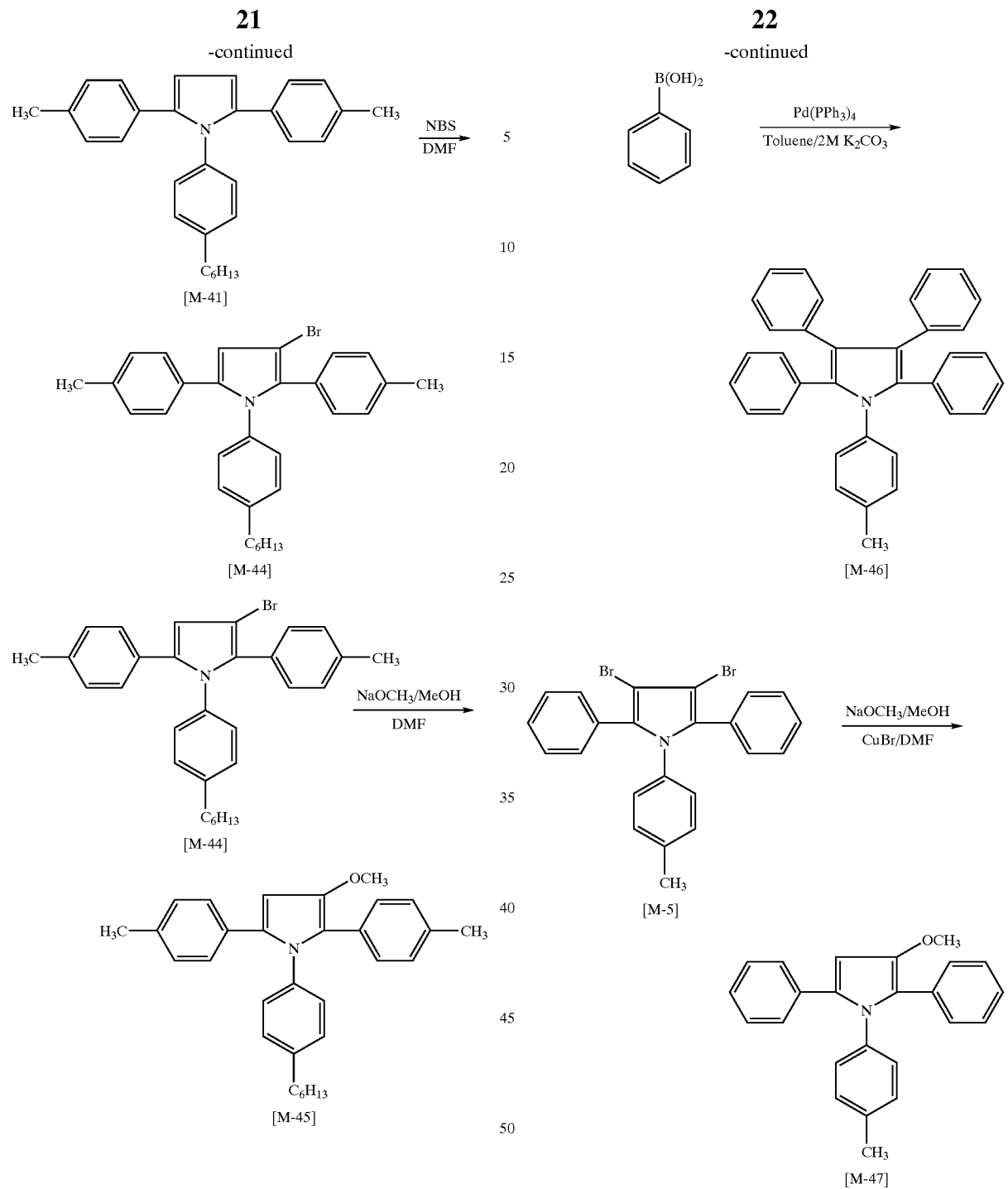
Reaction Scheme 11:
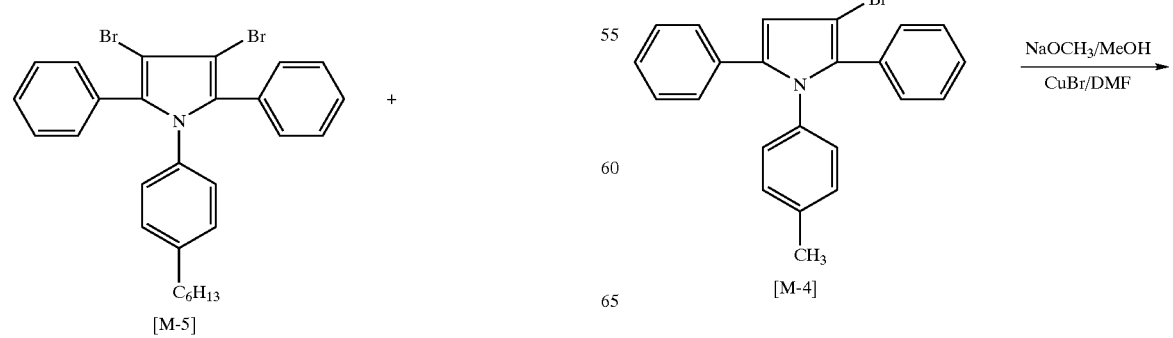

-continued
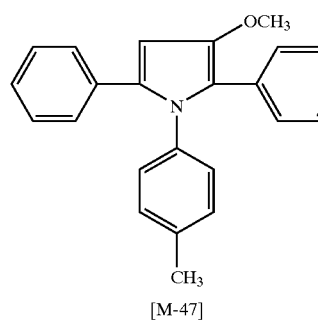
[M-47]
Reaction Scheme 12:
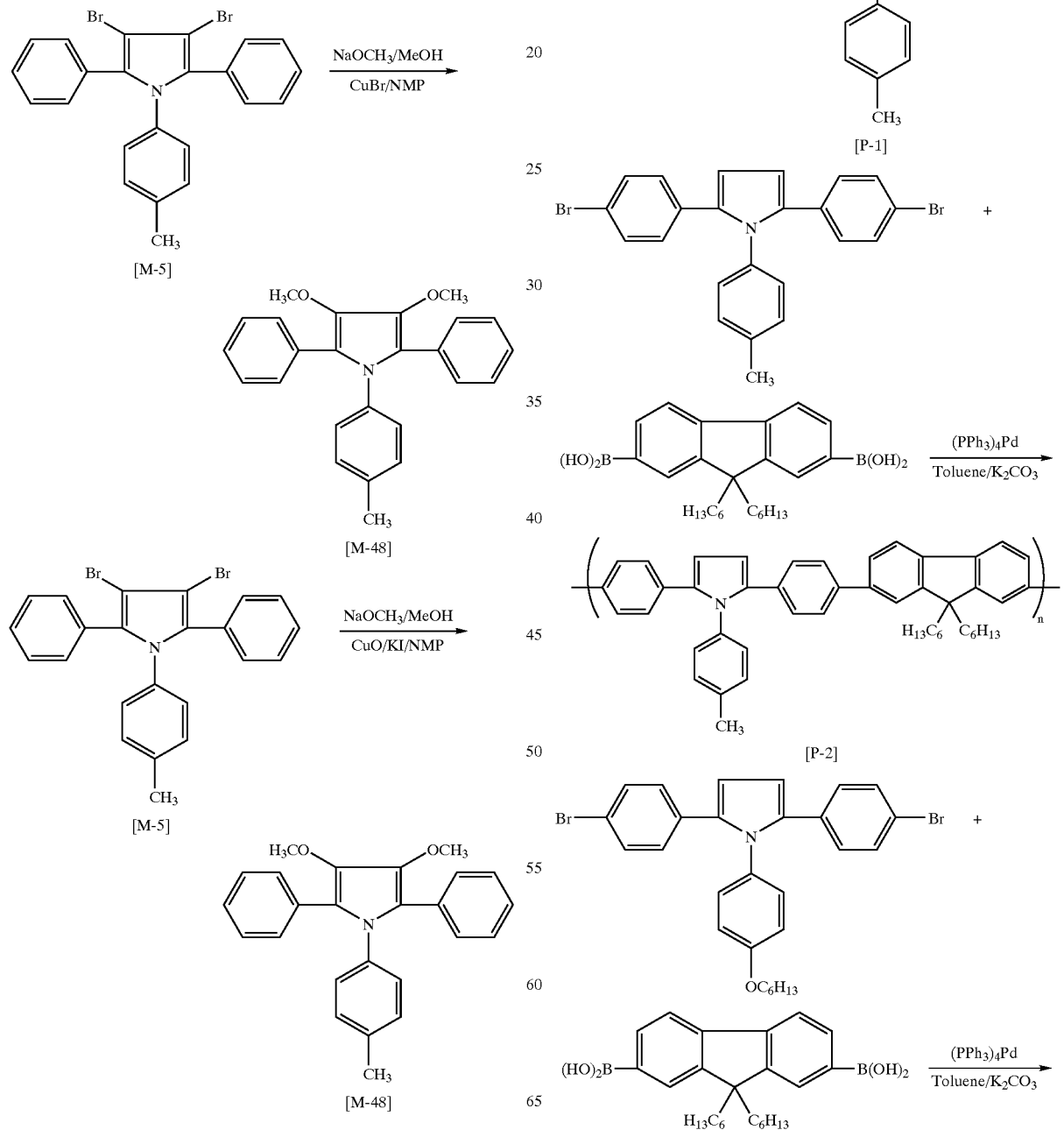
[M-5]
[M-48]
[M-5]
[M-48]
Reaction Scheme 13:
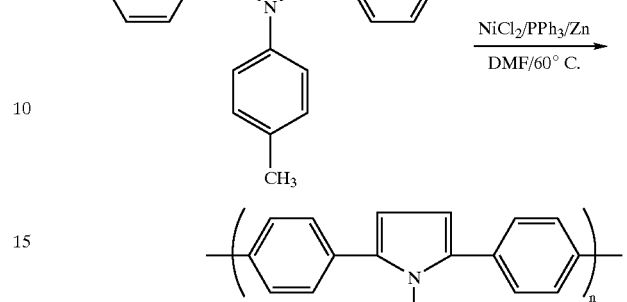
[P-1]
[P-2]

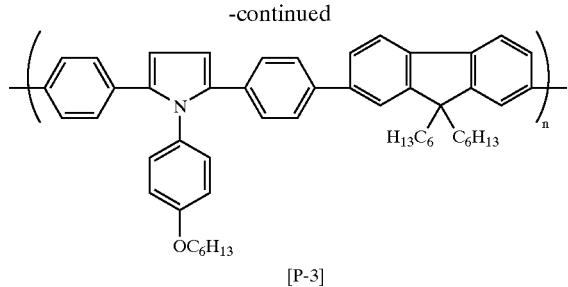

[P-3]

Reaction Scheme 14:

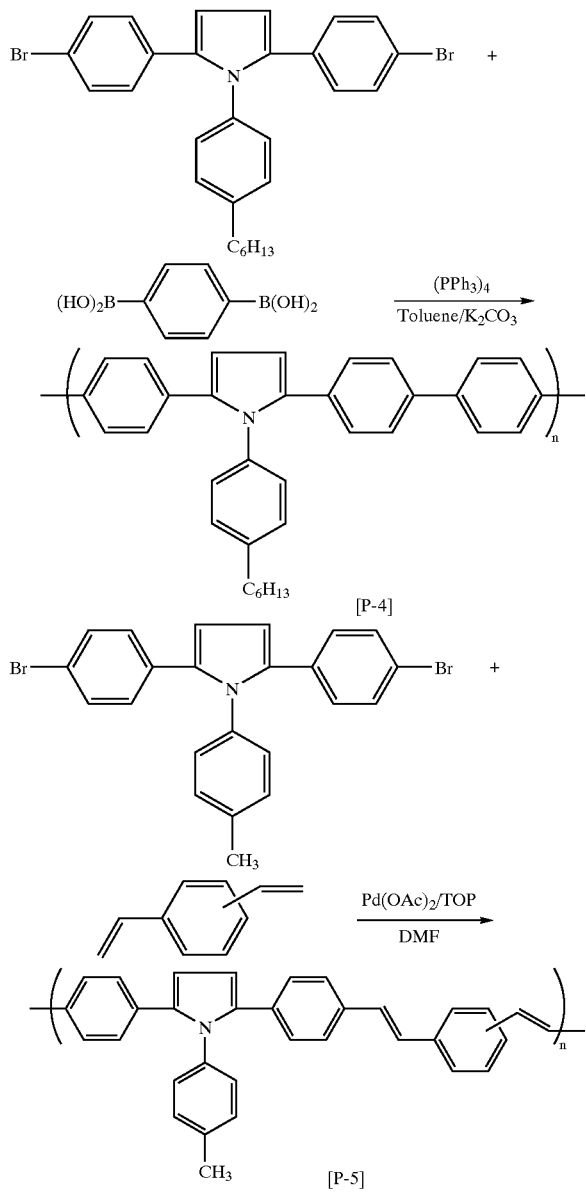

However, in addition to the above-described method, if final products are the same, any known methods can be applied to prepare pyrrole compounds and polymers thereof of the present invention. That is, in preparation of the pyrrole compounds and/or polymers thereof according to the present invention, a solvent, reaction temperature, concentration of reactants, catalyst or the like may not be specifically limited to those as shown in the above reaction schemes, and likewise the preparation yield.

The organic and polymer EL element and/or other optical devices of the present invention can be fabricated using the compound and polymers thereof having structures as shown in the Reaction Schemes 1 through 14 as a core material.

The pyrrole compounds or polymers thereof of the present invention can be made into a thin film by a know method such as vacuum-deposition, spin-coating, roll-coating, bar-coating, ink-jet printing or the like, and then can be directly used as an EL material.

In the structure, the EL element of the present invention include not only an EL element of a typical single-layered structure consisting of anode/light-emitting layer/cathode in which a light-emitting layer material is inserted between an anode and a cathode, but also an EL element of a multi-layered structure consisting of anode/hole transporting layer/light-emitting layer/electron transporting layer/cathode in which a hole transporting layer and an electron transporting layer material (Japanese Laid Open No. 2-135361, 3-152184 and 6-207170) are additionally used.

In one embodiment of the present invention, an EL element can be made to have a structure of anode/hole injection layer/hole transporting layer/light-emitting layer/electron transporting layer/cathode, in which poly (ethylenedioxy)thiophene (PEDOT), polyaniline, copper phthalocyanine (CuPc) or the like widely known as a hole injection layer material is located between the anode and the hole transporting layer. That is, in the present invention, there is no limitation on structures of the EL element.

Furthermore, in addition to as a material for the light-emitting layer, the pyrrole compounds and/or polymers thereof according to the present invention can be used as a core material for a hole transporting layer and/or electron transporting layer, or a hole injection layer of an EL element.

In the EL element of the present invention, a material in which a metal or metallic oxide such as indium-tin oxide (ITO), gold, copper, tin oxide or zinc oxide, or an organic semi-conducting compound such as polypyrrole, polyaniline or polythiopene is coated onto a transparent support substrate such as glass, transparent plastic or quartz, usually at a thickness of 10 nm to 1 μm, can be used as an anode. As a cathode, a metal such as sodium, magnesium, calcium, aluminum, indium, silver, gold or copper, or alloys thereof can be used.

In the EL element of a multi-layered structure, a material in which polyvinylcarbazole, 2,5-bis(4'-diethylaminophenyl)-1,3,4-oxadiazole, N,N'-diphenyl-N, N'-(3-methylphenyl)-1,1'-biphenyl-4,4'-diamine (TPD) or the like is coated by a known thin film forming method such as a vacuum-depositing, spin-coating, casting or an LB method can be used as a hole transporting layer, and a material in which a known compound such as tris(8-hydroxyquinolynato)aluminum (referred to as "Alq3", hereinafter), 2-(4'-t-butylphenyl)-5-(4"-biphenyl)-1,3,4-oxadiazole, 2,4,7-trinitro-9-florenone or the like is coated by a known thin film forming method such as a vacuum-depositing, spin-coating, casting or LB method can be used as an electron transporting layer.

An EL material comprising different kind of pyrrole compounds or polymers thereof according to the present invention can be used by being blended with the material for the hole transporting layer or electron transporting layer as described above; a soluble PPV or PTh, or derivatives thereof; known light-emitting material such as dinaphthyl anthracene compounds, tetra-t-butyl pyrene, spyrofluorene compounds or fluorene polymer; a doping material; or polymers thereof.

For example, a polymer according to the present invention can be dissolved together with polyvinylcarbazole, poly(1,4-dihexyloxy-2,5-phenylenevinylene), poly(9,9'-dioctylfluorene) or the like in an organic solvent such as chloroform, and then the resulting solution can be coated onto an anode, hole injection layer or hole transporting layer depending on the desired element structure by a spin-coating or casting method as a thin film. In this case, the amount of the light-emitting polymer of the present invention can be in the range of 0.001 to 99% and preferably, 0.1 to 50% of polyvinylcarbazole, and the thickness of the thin film can be in the range of 5 nm to 5 μm and preferably, 50 nm to 1 μm, but not limited thereto.

The EL material of the present invention can be used by being blended with a polymer that can be dissolved in a typical organic solvent in the above concentration and then can be made into a thin film in the above thickness range. Examples of the polymer which can be blended with the EL material of the present invention include a thermoplastic polymer such as polymethylmethacrylate, polyacrylate, polystyrene, polycarbonate, polyvinylchloride, polyethylene, polypropylene, polyacrylonitrile, polyvinylpyrrolidone, polyvinylalcohol, polyvinylacetate, polyvinylbutylal, polyvinylamine, polycaprolactone, polyethyleneterephtalate, polybutyleneterephtalate, polyurethane, ABS, polysulfone and polyvinylfluoride, and a commonly used resin such as acetal, polyamide, polyimide, polyester, alkid, urea, furan, nylon, melamine, phenol, silicone and epoxy.

EXAMPLES

The present invention will be now described in more detail with reference to the following examples. However, the examples are to illustrate the present invention and not to limit the scope of the present invention thereto.

Syntheses of Monomers

Example 1

Synthesis of 1,4-Diphenyl Butadiyne [M-1]

50 g (0.49 mol) of phenylacetylene, 2.42 g (24 mmol) of copper(I) chloride and 2.84 g (24 mmol) of N,N,N',N'-tetramethylethylenediamine (TMEDA) were put into a 1 L round-bottomed flask containing 400 ml of acetone and equipped with a mechanical stirrer. The resulting mixture was vigorously stirred at room temperature for one hour while bubbling oxygen gas. After the reaction was completed, solvent was removed under a reduced pressure. The residue was precipitated in 5% hydrochloric acid, to give white solid, which was then filtered. The solid was recrystallized from ethanol and then dried to give 43.8 g (88.5%) of colorless crystal having a melting point of 87–88° C.

$^1$H-NMR (CDCl$_3$): δ 7.3–7.56 (m, 10H, aromatic).

Example 2

Synthesis of 1,4-bis(4-Bromophenyl)butadiyne [M-2]

40.75 g (225 mmol) of p-bromophenylacetylene, 1.11 g (14 mmol) of copper(I) chloride and 1.31 g (14 mmol) of N,N,N',N'-tetramethylethylenediamine were put into a 1 L round-bottomed flask containing 500 ml of acetone and equipped with a mechanical stirrer. The resulting mixture was vigorously stirred at room temperature for one hour while bubbling oxygen gas. After the reaction was completed, acetone was removed. The residue was precipitated in 5% hydrochloric acid to obtain pale yellow-colored solid, which was recrystallized from chloroform and then dried to give 39.8 g (98.2%) of pale yellow-colored solid aving a melting point of 264–265° C.

$^1$H-NMR (CDCl$_3$): δ 7.38–7.58 (m, 8H, aromatic).

Example 3

Synthesis of N-(p-Tolyl)-2,5-diphenylpyrrole [M-3]

Under an argon atmosphere, 30 g (148 mmol) of [M-1], 15.9 g (148 mmol) of p-toluidine and 0.25 g (37 mmol) of copper(I) chloride were put into a 250 ml round-bottomed flask. The resulting mixture was then stirred at 150° C. for 5 hours. After the reaction was completed, the reaction mixture was cooled down, diluted with 100 ml of chloroform and then washed with 5% hydrochloric acid several times. The organic layer was washed with water several times and then dried with anhydrous magnesium sulfate. The solvent was removed to give solid, which was recrystalized from ethyl acetate/ethanol, to obtain white solid having a melting point of 207–208° C.

$^1$H-NMR (CDCl$_3$): δ 2.36 (s, 3H, —CH$_3$), 6.50 (s, 2H, —CH—), 6.90–7.20 (m, 14H, aromatic).

Example 4

Synthesis of N-(p-Tolyl)-2,5-diphenyl-3-bromopyrrole [M-4]

3.0 g (7.7 mmol) of [M-3] and 50 ml of dimethylformamide were put into a 500 ml round-bottomed flask at 0° C. While stirring, a solution in which 1.76 g (7.8 mmol) N-bromosuccinimide was dissolved in 50 ml of dimethylformamide was slowly dropped into the above mixture with a dropping funnel. The resulting mixture was then reacted at room temperature for 4 hours. After the reaction was completed, the reaction mixture was precipitated in 1 L of water to give pale yellow powders, which was then filtered. The powder was washed with water and ethanol sufficiently, and then recrystallized from chloroform, to give 2.71 g (91%) of white solid having a melting point of 201–202° C.

$^1$H-NMR (CDCl$_3$): δ 2.27 (s, 3H, —CH$_3$), 6.52 (s, 1H, —CH—), 6.78–7.26 (m, 14H, aromatic H).

Example 5

Synthesis of N-(p-Tolyl)-2,5-diphenyl-3,4-dibromopyrrole [M-5]

3.05 g (10 mmol) of [M-3] and 100 ml of dimethylformamide were put into a 1 L round-bottomed flask at room temperature. While stirring, 3.6 g (20.2 mmol) N-bromosuccinimide dissolved in 50 ml of dimethylformamide was slowly dropped into the resulting mixture with a dropping funnel. The obtained mixture was then reacted at room temperature for 24 hours. After the reaction was completed, the reaction mixture was precipitated in 1 L of water to obtain pale yellow powder, which was filtered, washed with water and ethanol sufficiently and then recrystallized from chloroform, to give 3.97 g (86.3%) of white solid having a melting point of 227–228° C.

$^1$H-NMR (CDCl$_3$): δ 2.21 (s, 3H, —CH$_3$), 6.70–7.25 (m, 14H, aromatic).

Example 6

Synthesis of N-(p-Tolyl)-2,5-bis(p-bromophenyl)-3,4-dibromopyrrole [M-6]

13.68 g (44.2 mmol) of [M-3] and 500 ml of chloroform were put into a 1 L round-bottomed flask and stirred to dissolve. At room temperature, a small amount of Iodine was added to the resulting solution for activating. 6.14 g (185.7 mmol) bromine diluted with 200 ml of chloroform was added dropwise to the resulting mixture with a dropping funnel at 0° C. The reaction mixture was reacted at room temperature for 24 hours and then neutralized by adding 20% aqueous potassium hydroxide. The organic layer was then separated, washed with water several times and then dried with anhydrous magnesium sulfate. Solvent was removed to give solid, which was then recrystallized from ethyl acetate, to obtain 25.3 g (91.6%) of white solid having a melting point of 240–242° C.

$^1$H-NMR (CDCl$_3$): δ 2.22 (s, 3H, —CH$_3$), 6.70–7.25 (m, 16H, aromatic).

Example 7

Synthesis of N-(p-Tolyl)-2,5-diphenyl-3-octanoylpyrrole [M-7]

0.68 g (5.1 mmol) of aluminum trichloride and 50 ml of chloroform were put into a 500 ml round-bottomed flask equipped with a reflux condenser and dropping funnel. While stirring, 0.83 g (5.1 mmol) of octanoyl chloride diluted with 10 ml of chloroform was added to the resulting mixture with a dropping funnel at room temperature. 1.5 g (4.8 mmol) of [M-3] dissolved in 20 ml of chloroform was dropped into the obtained mixture with a dropping funnel, and the resulting reaction mixture was then reacted at 50° C. for 24 hours. After the reaction was completed, the reaction mixture was poured onto 10 g of ice. The organic layer was combined, washed with water several times, and then dried with anhydrous magnesium sulfate, from which the solvent was removed. The residue was purified by column chromatography (ethyl acetate/hexane (1/5) to give 1.97 g (93.4%) of pure pale yellow viscous oil.

$^1$H-NMR (CDCl$_3$): δ 0.86 (t, 3H, —CH$_3$), 1.13–1.75 (m, 10H, —CH$_2$—), 2.21 (s, 3H, —CH$_3$), 2.38 (t, 2H, —COCH$_2$—), 6.81–7.23 (m, 15H, —CH— and aromatic).

Example 8

Synthesis of N-(p-Tolyl)-2,5-diphenyl-3,4-dioctanoylpyrrole [M-8]

1.42 g (10.7 mmol) of aluminum trichloride and 50 ml of chloroform were put into a 500 ml round-bottomed flask equipped with a reflux condenser and dropping funnel. While stirring, 1.74 g (10.7 mmol) of octanoyl chloride diluted with 10 ml of chloroform was added the resulting solution with a dropping funnel at room temperature. 1.5 g (4.8 mmol) of [M-3] dissolved in 20 ml of chloroform was dropped into the obtained mixture with a dropping funnel, and the reaction mixture was then reacted at 50° C. for 24 hours. After the reaction was completed, the reaction mixture was poured onto 100 g of ice. The organic layer was combined, washed with water several times, and then dried with anhydrous magnesium sulfate, from which the solvent was removed. The residue was purified by column chromatography (ethyl acetate/hexane (1/5) to obtain yellow-colored solid, which was recrystallized from hexane, to give 2.15 g (78.9%) of pure pale yellow-colored solid having a melting point of 51–53° C.

$^1$H-NMR (CDCl$_3$): δ 0.83 (t, 6H, —CH$_3$), 1.12–1.60 (m, 20H, —CH$_2$—), 2.21 (s, 3H, —CH$_3$), 2.38 (t, 4H, —COCH$_2$—), 6.71–7.30 (m, 14H, aromatic).

Example 9

Synthesis of N-(p-Tolyl)-2,5-diphenyl-3,4-dioctylpyrrole [M-9]

0.5 g (8.9 mmol) of potassium hydroxide and 10 ml of ethylene glycol were put into a round-bottomed flask equipped with a thermometer and reflux condenser under an atmosphere, and the resulting mixture was stirred to dissolve at 100° C. for one hour. At the same temperature, 1.0 g (1.8 mmol) of [M-8] and 0.2 g (4.0 mmol) of hydrazine monohydrate were slowly added in portions to the above mixture, respectively. After completing the addition, the resulting reaction mixture was heated to 150° C. and refluxed for 24 hours. After the reaction was completed, the reaction mixture was cooled down to room temperature, and then the reaction was quenched with water. The reaction mixture was then washed with 6N hydrochloric acid, washed with water several times and then extracted with chloroform. The combined organic extract was dried with anhydrous magnesium sulfate, and then solvent was removed therefrom to obtain oily product, which was purified by column chromatography (ethyl acetate/hexane (1/10)) and recrystallized from hexane, to give 0.4 g (42%) of yellow-colored solid having a melting point of 100–101° C.

$^1$H-NMR (CDCl$_3$): δ 0.82–1.70 (m, 30H, —CH$_3$ and —CH$_2$—), 2.21 (t, 4H, —CCH$_2$—), 2.26 (s, 3H, —CH$_3$), 6.79–7.41 (m, 14H, aromatic).

Example 10

Synthesis of N-(p-Tolyl)-2,5-diphenyl-3-octylpyrrole [M-10]

Under an atmosphere, 0.5 g (8.9 mmol) of potassium hydroxide and 10 ml of ethylene glycol were put into a round-bottomed flask equipped with a thermometer and reflux condenser. The resulting mixture was stirred to dissolve potassium hydroxide at 100° C. for one hour. At the same temperature, 1 g (2.3 mmol) of [M7] and 0.15 g (3.0 mmol) of hydrazine monohydrate were slowly added in portions to the above mixture, respectively. After completing the addition, the resulting mixture was heated to 150° C. and refluxed for 24 hours. After the reaction was completed, the reaction mixture was cooled down to room temperature, and the reaction was quenched with water. The reaction mixture was washed with 6N hydrochloric acid, washed with water several times and then extracted with chloroform. The combined organic extract was dried with anhydrous magnesium sulfate, from which the solvent was removed, to obtain oily product, which was purified by column chromatography (ethyl acetate/hexane (1/10)) and then recrystallized from hexane, to give 0.8 g (82%) of pale yellow oil.

$^1$H-NMR (CDCl$_3$): δ 0.88–1.80 (m, 15H, —CH$_3$ and —CH$_2$—), 2.23 (s, 3H, —CH$_3$), 2.35 (t, 2H, —CCH$_2$—), 6.38 (s, 1H, —CH—), 6.77–7.28 (m, 14H, aromatic).

Example 11

Synthesis of N-(p-Tolyl)-2,5-diphenyl-3-hexylpyrrole [M-11]

Under an argon atmosphere, 3 g (7.7 mmol) of [M-4] and 0.21 g of [1,3-bis(diphenylphosphino)propane]dichloro nickel(II) were put into a round-bottomed flask equipped with a reflux condenser, and then dissolved in 100 ml THF. 9 ml of 2.0M magnesium hexylbromide (18 mmol) was slowly added dropwise to the resulting solution at 0° C., and then the temperature was raised to room temperature. The reaction mixture was reacted at room temperature for 3 hours and then refluxed for 24 hours. After the reaction was completed, the reaction mixture was cooled down to room temperature, diluted with ice water and then extracted with chloroform several times. The combined organic extract was dried with anhydrous magnesium sulfate, from which the solvent was removed, to obtain an oily product, which was purified by column chromatography (hexane) to give 3.06 g (87.7%) of pale yellow oil.

$^1$H-NMR (CDCl$_3$): δ 0.89 (t, 3H, —CH$_3$), 1.29–1.70 (m, 8H, —CH$_2$—), 2.23 (s, 3H, —CH$_3$), 2.51 (t, 2H, —CCH$_2$—), 6.40 (s, 1H, —CH—), 6.78–7.15 (m, 14H, aromatic).

Example 12

Synthesis of N-(p-Tolyl)-2,5-diphenyl-3-hexyl-4-bromopyrrole [M-12]

Under an argon atmosphere, 10 g (21.4 mmol) of [M-5] and 250 ml of THF were put into a round-bottomed flask, into which 25 ml of 2.5M n-butyllithium (64.2 mmol) was slowly dropped at −78° C. The temperature was then allowed to reach to room temperature. About one hour later, the temperature was cooled down to −78° C. and then 10.6 g (64.2 mmol) of bromohexane was slowly dropped into the reaction flask. The temperature was then raised to room temperature, and the reaction mixture was reacted for 24 hours. The reaction mixture was poured onto 300 g of ice to quench the reaction and then extracted with chloroform several times. The combined organic extract was washed with water and then completely dried with anhydrous magnesium sulfate. The solvent was removed to give an oily product, which was purified by column chromatography (ethyl acetate/hexane (1/10)) and then recrystallized from ethanol, to give 7.95 g (77.8%) of yellow-colored solid having a melting point of 86–89° C.

$^1$H-NMR (CDCl$_3$): δ 0.85 (t, 3H, —CH$_3$), 1.27–1.70 (m, 8H, —CH$_2$—), 2.23 (s, 3H, —CH$_3$), 2.51 (t, 2H, —CCH$_2$—), 6.78–7.15 (m, 14H, aromatic).

Example 13

Synthesis of N-(4-Bromophenyl)-2,5-diphenylpyrrole [M-13]

Under an argon atmosphere, 15 g (74 mmol) of 1,4-diphenylbutadiyne, 12.76 g (74 mmol) of p-bromoaniline and 1.84 g (18 mmol) copper(I) chloride were put into 500 ml round-bottomed flask, and the resulting mixture was reacted at 150° C. for 5 hours while stirring. After the reaction was completed, the reaction mixture was cooled down to room temperature, dissolved in chloroform and then washed with 5% hydrochloric acid several times. The combined organic extract was washed with water several times and then dried with anhydrous magnesium sulfate. The solvent was removed to obtain solid, which was recrystallized from ethyl acetate to give 20.4 g (73.5%) white solid having a melting point of 218–219° C.

$^1$H-NMR (CDCl$_3$): δ 6.48 (s, 2H, —CH—), 6.86–7.36 (m, 14H, aromatic).

Example 14

Synthesis of N-(4-Trimethylsilylethynylphenyl)-2,5-diphenylpyrrole [M-14]

Under a nitrogen atmosphere, 10 g (26.7 mmol) of [M-13], 0.57 g (0.8 mmol) of bis(triphenylphosphine) palladium(II) dichloride and 0.16 g (0.8 mmol) of copper iodide were dissolved in 250 ml of diisopropylamine in a 500 ml 3-necked flask equipped with a stirrer, thermometer and reflux condenser. 7.87 g (80 mmol) of trimethylsilylacetylene (TMSA) was slowly dropped into the resulting solution at room temperature. The reaction mixture was then slowly heated to 70–80° C. and then refluxed for 12 hours. After the reaction was completed, the reaction mixture was cooled down to room temperature. Precipitated salt was filtered off, and the solvent was removed under a reduced pressure. The residue was dissolved in methylene chloride, washed with water several times and then dried with anhydrous magnesium sulfate. The solvent was removed under a reduced pressure. The residue was purified by column chromatography (methylene chloride/hexane (1/10)) and then recrystallized from ethyl acetate, to give 9.16 g (87.6%) of white solid having a melting point of 183–184° C.

$^1$H-NMR (CDCl$_3$): δ 0.22 (s, 9H, —CH$_3$), 6.48 (s, 2H, —CH—), 6.86–7.36 (m, 14H, aromatic).

Example 15

Synthesis of N-(4-Ethynylphenyl)-2,5-diphenylpyrrole [M-15]

6.76 g (0.017 mol) of [M-14] was put into a 1 L round-bottomed flask equipped with a stirrer and dissolved in a mixture of 300 ml of THF and 200 ml of methanol, into which 10 ml of 20% aqueous KOH solution was dropped at room temperature. The resulting mixture was then reacted for 24 hours. After the reaction was completed, the reaction mixture was dried under a reduced pressure to remove the solvent and then extracted with methylene chloride several times. The combined extract was washed with water several times and then dried with anhydrous magnesium sulfate. The solvent was removed under a reduced pressure. The residue was recrystallized from ethyl acetate, to give 5.19 g (94.2%) of white solid having a melting point of 208–209° C.

$^1$H-NMR (CDCl$_3$): δ 3.12 (s, 2H, —CCH), 6.48 (s, 2H, —CH—), 7.38–6.90 (m, 12H, aromatic).

Example 16

Synthesis of N-(p-Tolyl)-2,5-bis(4-bromophenyl)pyrrole [M-16]

Under an argon atmosphere, 31.6 g (88 mmol) of [M-2], 15.1 g (88 mmol) of p-toluidine and 2.17 g (22 mmol) of copper(I) chloride were put into a 500 ml round-bottomed flask, and the resulting mixture was stirred at 200° C. for 5 hours. After the reaction was completed, the reaction mixture was cooled down to room temperatue and dissolved in chloroform. The organic layer was washed with 5% hydrochloric acid several times, washed with water several times and then dried with anhydrous magnesium sulfate. The solvent was removed to obtain solid, which was recrystallized from ethyl acetate and chloroform to give 28.5 g (69.6%) white solid having a melting point of 262–264° C.

$^1$H-NMR (CDCl$_3$): δ 2.35 (s, 3H, —CH$_3$), 6.46 (s, 2H, —CH—), 6.88–7.30 (m, 12H, aromatic).

Example 17

Synthesis of N-(4-n-Hexyloxyphenyl)-2,5-bis(4-bromophenyl)pyrrole [M-17]

Under an argon atmosphere, 5.02 g (14 mmol) of [M-2], 2.7 g (14 mmol) of p-hexyloxyaniline and 0.35 g (3 mmol) of copper(I) chloride were put into a 250 ml round-bottomed flask, and the resulting mixture was stirred at 170° C. for a 5 hours. After the reaction was completed, the reaction mixture was cooled down to room temperature and then dissolved in chloroform. The organic layer was washed with 5% hydrochloric acid several times, washed with water several times and then dried with anhydrous magnesium sulfate, from which the solvent was removed to obtain solid. After the obtained solid was recrystallized from ethyl acetate, to give 1.64 g (21.3%) of white solid having a melting point of 201–202° C.

$^1$H-NMR (CDCl$_3$): δ 0.94 (t, 3H, —CH$_3$), 1.34–1.83 (m, 8H, —CH$_2$—), 3.95 (t, 2H, —OCH$_2$—), 6.47 (s, 2H, —CH—), 6.77–7.33 (m, 12H, aromatic).

Example 18

Synthesis of N-(4-n-Hexylphenyl)-2,5-bis(4-bromophenyl)pyrrole [M-18]

Under an argon atmosphere, 4.19 g (11.6 mmol) of [M-2], 2.07 g (11.6 mmol) of p-hexylaniline and 0.29 g (2.9 mmol) of copper(I) chloride were put into a 100 ml round-bottomed flask, and the resulting mixture was stirred at 180° C. for 5 hours. After the reaction was completed, the reaction mixture was cooled down to room temperature and then dissolved in chloroform. The organic layer was washed with 5% hydrochloric acid several times, washed with water several times and then dried with anhydrous magnesium sulfate, from which the solvent was removed. The residual solid was recrystallized from ethyl acetate, to give 1.9 g (30.4%) of white solid having a melting point of 198–199° C.

$^1$H-NMR (CDCl$_3$): δ 0.87 (t, 3H, —CH$_3$), 1.30–1.68 (m, 8H, —CH$_2$—), 2.62 (t, 2H, —CCH$_2$—), 6.46 (s, 2H, —CH—), 6.89–7.31 (m, 12H, aromatic).

Example 19

Synthesis of N-(4-n-Hydroxphenyl)-2,5-bis(4-bromophenyl)pyrrole [M-19]

Under an argon atmosphere, 3.55 g (9.9 mmol) of [M-2], 1.18 g (9.9 mmol) of p-hydroxyaniline and 0.25 g (2.5 mmol) of copper(I) chloride were put into a 100 ml round-bottomed flask. The resulting mixture was stirred at 180° C. for 10 hours. After the reaction was completed, the reaction mixture was cooled down to room temperature and then dissolved in chloroform. The organic layer was washed with 5% hydrochloric acid several times, washed with water several times and then dried with anhydrous magnesium sulfate, from which the solvent was removed. The residual solid was recrystallized from ethyl acetate/ethanol, to give 1.1 g (24%) of pale yellow-colored solid having a melting point of 284–285° C.

$^1$H-NMR (CDCl$_3$): δ 4.78 (s, 1H, —OH), 6.46 (s, 2H, —CH—), 6.72–7.50 (m, 12H, aromatic).

Example 20

Synthesis of N-(p-Tolyl)-2,5-bis(4-trimethylsilylethynylphenyl)pyrrole [M-20]

Under a nitrogen atmosphere, 10 g (20 mmol) of [M-16], 0.75 g (1 mmol) of bis(triphenylphosphine)palladium(II) dichloride and 0.21 g (1 mmol) of copper iodide were dissolved in 250 ml of diisopropylamine in a 500 ml 3-necked flask equipped with a stirrer, thermometer and reflux condenser. 10.52 g (0.1 mol) of trimethylsilylacetylene was then slowly dropped into the resulting mixture at room temperature. The reaction mixture was slowly heated to 70° C. and refluxed for 12 hours. After the reaction was completed, the reaction mixture was cooled down to room temperature, the precipitated salt was filtered off, and the solvent was then removed under a reduced pressure. The residue was dissolved in methylchloride again. The resulting organic solution was washed with water several times and then dried with anhydrous magnesium sulfate, from which the solvent was removed. The residual solid was recrystallized from ethyl acetate, to give 7.63 g (71%) of white solid having a melting point of 223–224° C.

$^1$H-NMR (CDCl$_3$): δ 0.22 (s, 18H, —SiCH$_3$), 2.38 (s, 3H, —CH$_3$), 6.50 (s, 2H, —CH—), 6.86–7.32 (m, 12H, aromatic).

Example 21

Synthesis of N-(p-Tolyl)-2,5-bis(4-ethynylphenyl)pyrrole [M-21]

6.93 g (14 mmol) of [M-20] was dissolved in a mixture of 400 ml of THF and 200 ml of methanol in a 1 L round-bottomed flask equipped with a stirrer, into which 10 ml of 20% KOH in water was dropped at room temperature. The resulting mixture was reacted for 24 hours. After the reaction was completed, the solvent was removed under a reduced pressure. The reaction mixture was extracted with methylene chloride several times. The combined organic extract was washed with water several times and then dried with anhydrous magnesium sulfate, from which the solvent was removed to obtain solid. The residual solid was recrystallized from ethyl acetate, to give 3.38 g (68.6%) of white solid having a melting point of 235–237° C.

$^1$H-NMR (CDCl$_3$): δ 2.38 (s, 3H, —CH$_3$), 3.08 (s, 2H, —CCH—), 6.52 (s, 2H, —CH—), 6.90–7.33 (m, 12H, aromatic).

Example 22

Synthesis of N-(p-Tolyl)-2,5-bis(4-stilbenyl)pyrrole [M-22]

Under an argon atmosphere, 3.01 g (6.4 mmol) of [M-16], 1.96 g (19.3 mmol) of triethylamine, 80 mg (0.3 mmol) of paladium(II) acetate and 0.59 g (1.9 mmol) of tri-o-tolylphosphine (TOP) were dissolved in 20 ml of dimethylformamide in a 100 ml 3-necked flask equipped with a stirrer, thermometer and reflux condenser. 2.68 g (25.7 mmol) of styrene was then added into the resulting mixture. The reaction mixture was reacted at 100° C. for 24 hours, cooled down to room temperature and then slowly dropped into a 500 ml of 2.0 N aqueous hydrochloric acid to precipitate solid, which is recovered. The recovered solid was sufficiently washed with water and ethanol, dried and then recrystallized from toluene, to give 2.64 g (79.8%) of pale yellow-colored solid having a melting point of 297–298° C.

$^1$H-NMR (CDCl$_3$): δ 2.34 (s, 3H, —CH$_3$), 6.50 (s, 2H, —CH—), 6.94–7.48 (m, 26H, aromatic and vinyl).

Example 23

Synthesis of N-(p-Tolyl)-2,5-bis(4-methylstilbenyl)pyrrole [M-23]

Under an argon atmosphere, 2.31 g (4.9 mmol) of [M-16], 1.5 g (14.8 mmol) of triethylamine, 56 mg (0.2 mmol) of paladium(II) acetate and 0.45 g (1.5 mmol) of tri-o-tolylphosphine (TOP) were dissolved in 20 ml of dimethylformamide in a 100 ml 3-necked flask equipped with a stirrer, thermometer and reflux condenser. 2.65 g (19.8 mmol) of p-methoxystyrene was added into the resulting mixture. The reaction mixture was reacted at 100° C. for 24 hours and then cooled down to room temperature. The reaction mixture was slowly dropped into a 500 ml of 2.0 N aqueous hydrochloric acid to precipitate solid. The precipitated solid was sufficiently washed with water and ethanol, dried and then recrystallized from toluene, to give 0.63 g (52.8%) of solid having a melting point of 314–316° C.

$^1$H-NMR (CDCl$_3$): δ 2.35 (s, 3H, —CH$_3$), 2.36 (s, 6H, —CH$_3$), 6.5 (s, 2H, —CH—), 7.00–7.38 (m, 24H, aromatic and vinyl).

Example 24

Synthesis of N-(p-Tolyl)-2,5-bis(4-methoxystilbenyl)pyrrole [M-24]

Under an argon atmosphere, 1.14 g (1.8 mmol) of [M-16], 1.11 g (10.9 mmol) of triethylamine, 40 mg (0.2 mmol) of palladium(II) acetate and 0.34 g (1.1 mmol) of tri-o-tolylphosphine were dissolved in 20 ml of dimethylformamide in a 100 ml 3-necked flask equipped with a stirrer, thermometer and reflux condenser. 1.96 g (14.6 mmol) of p-methoxystyrene was then added into the resulting mixture. The reaction mixture was reacted at 100° C. for 24 hours, cooled down to room temperature and then slowly dropped into a 500 ml of 2.0 N aqueous hydrochloric acid to precipitate solid. The precipitated solid was sufficiently washed with water and ethanol, dried and then recrystallized from ethyl acetate/ethanol, to give 1.92 g (67.7%) of solid having a melting point of 303–305° C.

$^1$H-NMR (CDCl$_3$): δ 2.36 (s, 3H, —CH$_3$), 3.83 (s, 6H, —OCH$_3$), 6.5 (s, 2H, —CH—), 6.80–7.42 (m, 24H, aromatic and vinyl).

Example 25

Synthesis of 9-Trimethylsilyl Ethynyl Anthracene [M-25]

Under an argon atmosphere, 40 g (0.155 mol) of 9-bromoanthracene, 3.3 g (4.6 mmol) of bis(triphenylphosphine)palladium(II) dichloride and 0.87 g (3 mmol) of copper Iodide were dissolved in 500 ml of diisopropylamine in a 1 L 3-necked flask equipped with a stirrer, thermometer and reflux condenser. 23 g (0.233 mol) of trimethylsilyl acetylene was then slowly dropped into the resulting mixture at room temperature. The reaction mixture was slowly heated to 80° C. and refluxed for 12 hours. After the reaction was completed, the reaction mixture was cooled down to room temperature, and then the precipitated salt was filtered off. The solvent was removed under a reduced pressure, and then the residue was dissolved in methylene chloride. The organic layer was washed with water several times and then dried with anhydrous magnesium sulfate. The solvent was removed to obtain orange-colored liquid, which was purified by silica gel column chromatography using hexane as an eluent, and then recrystallized from ethanol to give yellow crystal. The yellow crystal was recovered and sufficiently dried in a vacuum oven at 40° C., to give 32 g (83.3% yield) of the desired product having a melting point of 66–68° C.

$^1$H-NMR (CDCl$_3$), δ 0.41 (s, 9H, SiCH$_3$), 7.42–7.61 (m, 4H, aromatic), 7.96–8.00 (2H, aromatic), 8.41–8.58 (m, 3H, aromatic).

Example 26

Synthesis of 9-Ethynyl Anthracene [M-26]

27 g (0.098 mol) of 9-trimethylsilyl ethynyl anthracene was put into a 1 L round-bottomed flask equipped with a stirrer and dissolved in a mixture of 100 ml of THF and 200 ml of methanol. A solution in which 0.7 g of KOH was dissolved in 7 ml of water was dropped into the resulting solution. The reaction mixture was stirred at room temperature for 12 hours. After the reaction was completed, THF and methanol were removed under a reduced pressure. The reaction mixture was then extracted with methylene chloride. The organic layer was washed with water several times and then dried with anhydrous magnesium sulfate. The solvent was removed to obtain yellow viscous liquid, which was then purified by silica gel column chromatography using hexane as an eluent, to give 17 g (85.8% yield) of the desired product.

$^1$H-NMR (CDCl$_3$): δ 3.82 (s, 1H, acetylene), 7.42–7.61 (m, 4H, aromatic), 7.96–8.00 (2H, aromatic), 8.41–8.58 (m, 3H, aromatic).

Example 27

Synthesis of 1,4-bis(9-Anthracenyl)butadiyne [M-27]

15 g (0.074 mol) of 9-ethynyl anthracene, 0.36 g (3.7 mmol) copper(I) chloride, 0.43 g (3.7 mmol) of N,N,N',N'-tetramethylethylenediamine were put into a 500 ml round-bottomed flask equipped with a stirrer, and then dissolved in 200 ml of acetone. The resulting mixture was then vigorously stirred for two hours while purging oxygen gas, to give red-colored solid. After the reaction was completed, the solvent was mostly removed with a small amount remaining. The residue was then precipitated in 5% aqueous hydrochloric acid to obtain red-colored solid. The solid was filtered, washed sufficiently with water and ethanol, and then recrystallized from ethyl acetate, to give red-colored crystal. The red-colored crystal was recovered and then sufficiently dried in a vacuum oven at 40° C., to give 13 g (87.2% yield) of the desired product having a melting point of 280–282° C.

$^1$H-NMR (CDCl$_3$): δ 7.51–7.74 (m, 8H, aromatic), 8.04–8.10 (d, 4H, aromatic), 8.51 (s, 2H, aromatic), 8.70–8.78 (d, 4H, aromatic).

Example 28

Synthesis of N-(p-Tolyl)-2,5-bis(9-anthracenyl)pyrrole [M-28]

Under an argon atmosphere, 2.0 g (3.96 mmol) of [M-27], 1.6 g (14.8 mmol) of p-toluidine and 0.12 g (12.4 mmol) of copper(I) chloride were put into a 500 ml round-bottomed flask, and the resulting mixture was reacted at 200° C. for 5 hours. After the reaction was completed, the reaction mixture was cooled down to room temperature, into which chloroform was added in order to dissolve it. The organic layer was washed with 5% aqueous hydrochloric acid several times, washed with water several times and then dried with anhydrous magnesium sulfate, from which the solvent was removed to give red-colored solid. The solid was purified by silica gel column chromatography using chloroform as an eluent and then recrystallized from chloroform/ethyl acetate, to give yellow crystal. The yellow crystal was recovered and then sufficiently dried in a vacuum oven at 40° C., to give 1.6 g (64% yield) of the desired product having a melting point of 262–263° C.

$^1$H-NMR (CDCl$_3$): δ 2.03 (s, 3H, CH$_3$), 6.10–6.14 (d, 2H, phenyl), 6.49–6.53 (d, 2H, phenyl), 6.74 (s, 2H, pyrrole —CH) 7.43–7.57 (m, 10H, aromatic), 7.97–8.01 (d, 3H, aromatic), 8.16–8.20 (d, 3H, aromatic), 8.44 (s, 2H, aromatic).

Example 29

Synthesis of 1-Trimethylsilyl Ethynyl Naphthalene [M-29]

Under an argon atmosphere, 50 g (0.241 mol) of 1-bromonaphthalene, 2.5 g (3.6 mmol) of bis(triphenylphosphine)palladium(II) dichloride and 0.68 g (3.6 mmol) of copper Iodide were dissolved in 500 ml of diisopropylamine in a 1 L 3-necked flask equipped with a stirrer, thermometer and reflux condenser. 35.6 g (0.362 mol) of trimethylsilyl acetylene was slowly dropped into the resulting mixture at room temperature. The reaction mixture was slowly heated to 80° C. and refluxed 12 hours. After the reaction was completed, the reaction mixture was cooled down to room temperature. The precipitated salt was filtered off, and the solvent was removed from the filtrate under a reduced pressure. The residue was dissolved in methylene chloride. The organic layer was washed with water several times and then dried with anhydrous magnesium sulfate. The solvent was removed, to obtain a liquid. The obtained liquid was purified by silica gel column chromatography using hexane as an eluent, to give a colorless viscous liquid. The liquid was recrystallized from ethanol to give white crystal in needle-shape. The white crystal was recovered and then sufficiently dried at room temperature, to give 48 g (88.9% yield) of the desired product having a melting point of 41–43° C.

$^1$H-NMR (CDCl$_3$): δ 0.39 (s, 9H, SiCH$_3$), 7.25–7.9 (m, 6H, aromatic), 8.25–8.45 (m, 1H, aromatic).

Example 30

Synthesis of 1-Ethynyinaphthalene [M-30]

46 g (0.20 mol) of [M-29] was dissolved in 2 L of methanol in a 3 L round-bottomed flask equipped with a stirrer. A solution in which 7.8 g of KOH was dissolved in 280 ml of water was dropped into the resulting solution. The reaction mixture was then stirred at room temperature for 12 hours. After the reaction was completed, the methanol was removed under a reduced pressure, and then the reaction mixture was extracted with diethyl ether. The organic extract was washed with water several times and then dried with anhydrous magnesium sulfate. The solvent was removed to give viscous liquid, which was then purified by silica gel column chromatography using hexane as an eluent, to obtain 28 g (89.7% yield) of colorless viscous liquid.

$^1$H-NMR (CDCl$_3$): δ 3.55 (s, 1H, acetylene), 7.25–7.9 (m, 6H, aromatic), 8.25–8.45 (m, 1H, aromatic).

Example 31

Synthesis of 1,4-bis(1-Naphthyl)butadiyne [M-31]

26 g (0.170 mol) of [M-30], 0.84 g (8.54 mmol) of copper(I) chloride and 0.99 g (8.54 mmol) of N,N,N',N'-tetramethylethylenediamine were put into a 500 ml round-bottomed flask equipped with a stirrer, and dissolved in 200 ml of acetone. While oxygen gas purging, the reaction mixture was vigorously stirred for 2 hours, to generate yellow-colored solid. After the reaction was completed, the solvent was mostly removed with only a small amount remaining. The residue was precipitated in 5% aqueous hydrochloric acid, to obtain yellow-colored solid. The solid was filtered, washed with water and methanol sufficiently, and then recrystallized from methylene chloride/ethyl acetate, to give yellow crystal. The crystal was recovered and then dried sufficiently in a vacuum oven at 40° C., to give 22 g (85.3% yield) of the desired product having a melting point of 176–177° C.

$^1$H-NMR (CDCl$_3$): δ 7.41–7.67(m, 6H, aromatic), 7.81–7.90 (t, 6H, aromatic), 8.40–8.42 (d, 2H, aromatic).

Example 32

Synthesis of N-(p-Tolyl)-2,5-bis(1-naphthyl)pyrrole [M-32]

Under an argon atmosphere, 2.0 g (6.61 mmol) of [M-31], 1.06 g (9.92 mmol) of p-toluidine and 0.16 g (1.65 mmol) of copper(I) chloride were put into a 500 ml round-bottomed flask, and the resulting mixture was reacted at 170° C. for 5 hours. After the reaction was completed, the reaction mixture was cooled down to room temperature and dissolved in chloroform. The organic layer was washed with 5% aqueous hydrochloric acid several times, washed with water several times and then dried with anhydrous magnesium sulfate. The solvent was removed to obtain yellow viscous solution, which was purified by silica gel column chromatography using chloroform as an eluent and then recrystallized from hexane, to give yellow crystal. The crystal was recovered and then dried sufficiently in a vacuum oven at 40° C., to give 2.0 g (74% yield) of the desired product having a melting point of 105–106° C.

$^1$H-NMR (CDCl$_3$): δ 2.0 (s, 3H, CH$_3$), 6.60 (s, 2H, pyrrole —CH), 7.20–8.20 (m, 18H, aromatic).

Example 33

Synthesis of 4-Trimethylsilyl Ethynyl Methylbenzoate [M-33]

Under an argon atmosphere, 5 g (22 mmol) of ethyl 4-bromobenzoate, 0.31 g (0.44 mmol) of bis(triphenylphosphine)palladium(II) dichloride and 84 mg (0.44 mmol) of copper iodide were put into a 250 ml 3-necked flask equipped with a stirrer, thermometer and reflux condenser, and dissolved in 80 ml of diisopropylamine. 4.3 g (0.044 mol) of trimethylsilyl acetylene was then slowly dropped into the resulting solution at room temperature. The reaction mixture was slowly heated to 80° C. and refluxed for 12 hours. After the reaction was completed, the reaction mixture was cooled down to room temperature. The generated salt was filtered off, and the solvent was removed under a reduced pressure. The residue was dissolved in methylene chloride. The organic layer was washed with water several times and then dried with anhydrous magnesium sulfate. The solvent was removed to obtain liquid, which was then purified by silica gel column chromatography using hexane/ethyl acetate 3:1 as an eluent, to give 4.5 g (83.3% yield) of pale brown viscous liquid.

$^1$H-NMR (CDCl$_3$): δ 0.28 (s, 9H, SiCH$_3$), 1.38–1.42 (t, 3H, CH$_3$), 4.37–4.42 (q, 2H, OCH$_2$), 7.51–7.57 (d, 2H, aromatic), 7.99–8.10 (d, 2H, aromatic).

Example 34

Synthesis of 4-Ethynyl Methylbenzoate [M-34]

16 g (65 mmol) of [M-33] and 0.93 g (6.7 mmol) of potassium carbonate were put into a 500 ml round-bottomed flask equipped with a stirrer, into which 200 ml of methanol was added. The resulting mixture was stirred at room temperature for 5 hours. After the reaction was completed, methanol was removed under a reduced pressure. The reaction mixture was extracted with methylene chloride. The extract was washed with water several times and then dried with anhydrous magnesium sulfate. The solvent was removed, to give yellow viscous liquid. The liquid was then recrystallized from hexane to give yellow crystal, which was recovered and then dried sufficiently in a vacuum oven at 30° C., to give 6.7 g (64.4% yield) of the desired product having a melting point of 90–92° C.

$^1$H-NMR (CDCl$_3$): δ 3.24 (s, H, acetylene), 3.95 (s, 3H, OCH$_3$), 7.53–7.58 (d, 2H, aromatic), 7.97–8.03 (d, 2H, aromatic).

Example 35

Synthesis of 1,4-bis(4-Carboxymethylphenyl)butadiyne [M-35]

Under an atmosphere, 6.5 g (40 mmol) of [M-34], 0.2 g (2.02 mmol) of copper(I) chloride and 0.23 g (2.02 mmol) of N,N,N',N'-tetramethylethylenediamine were put into a 500 ml round-bottomed flask equipped with a stirrer, and dissolved in 200 ml of acetone. While oxygen gas purging, the reaction mixture was vigorously stirred for 2 hours, to generate solid. After the reaction was completed, the solvent was mostly removed with only a small amount remaining. The residue was precipitated in 5% aqueous hydrochloric acid to obtain yellow-colored solid. The solid was filtered, washed sufficiently with water and methanol, and then dried sufficiently in a vacuum oven at 40° C., to give 6.0 g (92.8% yield) of the desired product having a melting point of 91° C.

$^1$H-NMR (CDCl$_3$): δ 3.93 (s, 3H, OCH$_3$), 7.57–7.61 (d, 2H, aromatic), 8.00–8.04 (d, 2H, aromatic).

Example 36

Synthesis of N-(p-Tolyl)-2,5-bis(4-carboxymethylphenyl)pyrrole [M-36]

Under an argon atmosphere, 2.0 g (6.28 mmol) of [M-35], 0.74 g (6.91 mmol) of p-toluidine and 0.15 g (1.57 mmol) of copper(I) chloride were put into a 500 ml round-bottomed flask. The resulting mixture was reacted at 170° C. for 5 hours. After the reaction was completed, the reaction mixture was cooled down to room temperature and then dissolved in chloroform. The organic layer was washed with 5% aqueous hydrochloric acid several times, washed with water several times and then dried with anhydrous magnesium sulfate. The solvent was removed to give solid, which was purified by silica gel column chromatography using a methylene chloride as an eluent and then recrystallized from chloroform/ethanol, to give white crystal. The crystal was recovered and then dried sufficiently in a vacuum oven at 40° C., to give 0.53 g (20% yield) of the desired product having a melting point of 193–195° C.

$^1$H-NMR (CDCl$_3$): δ 2.35 (s, 3H, CH$_3$), 3.87 (s, 3H, OCH$_3$), 6.57 (s, 2H, pyrrole —CH), 6.90–7.84 (m, 12H, aromatic).

Example 37

Synthesis of N-(4-n-Hexylphenyl)-2,5-bis(4-carboxymethylphenyl)pyrrole [M-37]

Under an argon atmosphere, 6.0 g (19 mmol) of [M-36], 3.68 g (20 mmol) of 4-hexylaniline and 0.47 g (4.74 mmol) of copper(I) chloride were put into a 500 ml round-bottomed flask, and the resulting mixture was reacted at 170° C. for 5 hours. After the reaction was completed, the reaction mixture was cooled down to room temperature and then dissolved in chloroform. The organic layer was washed with 5% aqueous hydrochloric acid several times, washed with water several times and then dried with anhydrous magnesium sulfate, from which the solvent was removed to give solid. The solid was purified by silica gel column chromatography using methylene chloride as an eluent and then recrystallized from ethanol, to give white crystal. The crystal was recovered and then dried sufficiently in a vacuum oven at 40° C., to give 1.8 g (19.1% yield) of the desired product having a melting point of 129–130° C.

$^1$H-NMR (CDCl$_3$): δ 0.86 (br, 3H, CH$_3$), 1.26 (br, 6H, CH$_2$), 1.55 (s, 2H, CH$_2$), 3.84 (s, 6H, OCH$_3$), 6.56 (s, 2H, pyrrole —CH), 6.88–6.92 (d, 2H, aromatic), 7.03–7.09 (m, 6H, aromatic), 7.77–7.81 (d, 4H, aromatic).

Example 38

Synthesis of 4-Trimethylsilyl Ethynyl Toluene [M-38]

Under an argon atmosphere, 33 g (0.193 mol) of 4-bromotoluene, 2.7 g (3.85 mmol) of bis(triphenylphosphine)palladium(II) dichloride and 0.735 mg (3.85 mmol) of copper Iodide were put into a 1 L 3-necked flask equipped with a stirrer, thermometer and reflux condenser, and dissolved in 500 ml of diisopropylamine. 37.9 g (0.385 mol) of trimethylsilyl acetylene was slowly dropped into the resluting solution at room temperature. The reaction mixture was slowly heated to 80° C. and refluxed for 12 hours. After the reaction was completed, the reaction mixture was cooled down to room temperature. The precipitated salt was filtered off, and then the solvent was removed under a reduced pressure. The residue was dissolved in methylene chloride. The organic solution was washed with water several times and then dried with anhydrous magnesium sulfate. The solvent was removed to obtain liquid, which was purified by silica gel column chromatography using hexane as an eluent, to give 35 g (99.3% yield) of pale brown viscous liquid.

$^1$H-NMR (CDCl$_3$): δ 0.23 (s, 9H, SiCH$_3$), 2.33 (s, 3H, CH$_3$), 7.06–7.11 (d, 2H, aromatic), 7.33–7.37 (d, 2H, aromatic).

Example 39

Synthesis of 4-Tolyl Acetylene [M-39]

34.7 g (0.184 mol) of 4-trimethylsilyl ethynyl toluene was dissolved in 500 ml of methanol in a 1 L round-bottomed flask equipped with a stirrer. 10 ml of 20% KOH in water was added to the resulting solution. The reaction mixture was then stirred at room temperature for 5 hours. After the reaction was completed, water were poured into the flask. The reaction mixture was then extracted with ethyl ether several times. The combined extract was washed with water several times, and then dried with anhydrous magnesium sulfate. The solvent was removed, to give 21 g (98% yield) of yellow liquid.

$^1$H-NMR (CDCl$_3$): δ 2.34 (s, 3H, CH$_3$), 3.01 (s, 1H, acetylene), 7.10–7.13 (d, 2H, aromatic), 7.35–7.40 (d, 2H, aromatic).

Example 40

Synthesis of 1,4-bis(p-Tolyl)butadiyne [M-40]

20 g (0.17 mol) of tolylacetylene, 0.85 g (8.58 mmol) of copper(I) chloride and 1.0 g (8.58 mmol) of N,N,N',N'-tetramethylethylenediamine were put into a 500 ml round-bottomed flask equipped with a stirrer, and dissolved in 200 ml of acetone. While oxygen gas purging, the reaction mixture was vigorously stirred for 2 hours, to produce solid. After the reaction was completed, the solvent was mostly removed with only a small amount remaining. The residue was precipitated in 5% aqueous hydrochloric acid to obtain yellow-colored solid. The solid was filtered, washed sufficiently with water and methanol, and then dried sufficiently in a vacuum oven at 40° C., to give 14.5 g (74% yield) of the desired product having a melting point of 182–183° C.

$^1$H-NMR (CDCl$_3$): δ 2.36 (s, 3H, CH$_3$), 7.10–7.15 (d, 2H, aromatic), 7.40–7.42 (d, 2H, aromatic).

Example 41

Synthesis of N-(4-n-Hexylphenyl)-2,5-bis(p-tolyl) pyrrole [M-41]

Under an argon atmosphere, 14 g (60 mmol) of [M-40], 11.85 g (66.0 mmol) of 4-hexylaniline and 1.5 g (15 mmol) of copper(I) chloride were put into a 500 ml round-bottomed flask, and the resulting mixture was reacted at 180° C. for 5 hours. After the reaction was completed, the reaction mixture was cooled down to room temperature and dissolved in chloroform. The organic solution was washed with 5% hydrochloric acid several times, washed with water several times and then dried with anhydrous magnesium sulfate to obtain solid. The solid was purified by silica gel column chromatography using chloroform as an eluent and then recrystallized from acetone to obtain white crystal. The crystal was recovered and then dried sufficiently in a vacuum oven at 40° C., to give 17 g (68.8% yield) of the desired product having a melting point of 147–148° C.

$^1$H-NMR (CDCl$_3$): δ 0.90 (br, 3H, CH$_3$), 1.30 (br, 6H, CH$_2$), 1.60 (br, 2H, CH$_2$), 2.28 (s, 6H, CH$_3$), 2.58–2.62 (t, 2H, CH$_2$), 6.42 (s, 2H, pyrrole —CH), 6.95–7.02 (m, 12H, aromatic).

Example 42

Synthesis of N-(4-Hydroxyphenyl)-2,5-bis(p-tolyl) pyrrole [M-42]

Under an argon atmosphere, 13 g (56 mmol) of [M-40], 7.36 g (66 mmol) of 4-aminophenol and 1.39 g (14 mmol) of copper(I) chloride were put into a 500 ml round-bottomed flask, and the resulting mixture was reacted at 190° C. for 5 hours. After the reaction was completed, the reaction mixture was cooled down to room temperature and dissolved in chloroform. The organic solution was washed with 5% aqueous hydrochloric acid several times, washed with water several times and then dried with anhydrous magnesium sulfate, to obtain solid. The solid was purified by silica gel column chromatography using chloroform as an eluent and then recrystallized from ethyl acetate to obtain white crystal. The crystal was recovered and then dried sufficiently in a vacuum oven at 40° C., to give 10 g (52.6% yield) of the desired product having a melting point of 221–222° C.

$^1$H-NMR (CDCl$_3$): δ 2.25 (s, 6H, CH$_3$), 4.79 (s, 1H, OH), 6.41 (s, 2H, pyrrole —CH), 6.65–6.70 (d, 2H, aromatic), 6.90–6.98 (t, 10H, aromatic).

Example 43

Synthesis of N-(4-n-Hyxylphenyl)-2,5-bis(p-tolyl)-3,4-dibromopyrrole [M-43]

3.0 g (7.36 mmol) of [M-41], 2.75 g (15.4 mmol) of N-bromosuccinimide (NBS) and 0.013 g of benzoyl peroxide (BPO) were put into a 250 ml round-bottomed flask equipped with a reflux condenser and stirrer, and dissolved in 80 ml of tetramethylene chloride. The resulting mixture was stirred at 100° C. for 48 hours. After the reaction was completed, the reaction mixture was cooled down to room temperature and filtered to remove succinimide. The filtrate was washed with water sufficiently and then dried with anhydrous magnesium sulfate. The solvent was removed to obtain solid, which was recrystallized from chloroform/ethanol to obtain white crystal. The crystal was recovered and then dried sufficiently in a vacuum oven at 40° C., to give 3.3 g (82.5% yield) of the desired product having a melting point of 130–132° C.

$^1$H-NMR (CDCl$_3$): δ 0.86 (br, 3H, CH$_3$), 1.22 (br, 6H, CH$_2$), 1.52 (br, 2H, CH$_2$), 2.28 (s, 6H, CH$_3$), 2.48–2.55 (t, 2H, CH$_2$), 6.71–6.76 (d, 2H, aromtic), 6.90–6.95 (d, 2H, aromatic), 7.02 (s, 8H, aromatic).

Example 44

Synthesis of N-(4-n-Hexylphenyl)-2,5-bis(p-tolyl)-3-bromopyrrole [M-44]

8.0 g (19.6 mmol) of [M-41] was dissolved in 100 ml of dimethylformamide in a 500 ml round-bottomed flask equipped with a stirrer, and its temperature was lowered to 0–5° C. A solution in which 3.56 g (0.02 mol) of N-bromosuccinimide was dissolved in 50 ml of dimethylformamide was slowly dropped into the resulting solution. After the reaction was completed, the reaction mixture was cooled down to room temperature and then precipitated in 800 ml of water, to obtain white solid. The solid was filtered, washed sufficiently with water and methanol, and then recrystallized from chloroform/ethanol, to obtain white crystal. The crystal was recovered and then dried sufficiently in a vacuum oven at 40° C., to give 8.2 g (89.1% yield) of the desired product having a melting point of 134–135° C.

$^1$H-NMR (CDCl$_3$): δ 0.86 (br, 3H, CH$_3$), 1.22 (br, 6H, CH$_2$), 1.52 (br, 2H, CH$_2$), 2.28 (s, 6H, CH$_3$), 2.50–2.59 (t, 2H, CH$_2$), 6.45 (s, 1H, pyrrole —CH), 6.80–6.82 (d, 2H, aromatic), 6.95–7.02 (t, 10H, aromatic).

Example 45

Synthesis of N-(4-n-Hexylphenyl)-2,5-bis(p-tolyl)-3-methoxypyrrole [M-45]

Under an argon atmosphere, 0.47 g (0.02 mol) of sodium was put into a 100 ml 3-necked round-bottomed flask equipped with a reflux condenser and stirrer, into which 5 ml of pure methanol was added. When the sodium was completely dissolved, residual methanol was removed completely under a reduced pressure. 2 ml of pure methanol was added to the generated sodium methoxide. 5.0 g (10 mmol) of [M-44] and 0.14 g (1 mmol) of copper(I) bromide were add to the resulting solution, and then 10 ml of dimethylformamide was added thereto. The resulting mixture was reacted at 110° C. for 12 hours. After the reaction was completed, the reaction mixture was cooled down to room temperature. Water and chlororm were added to the reaction mixture to extract organic substances. The organic layer was washed sufficiently with water and then dried with anhydrous magnesium sulfate. The solvent was removed to obtain solid, which was recrystallized from hexane/ethyl acetate to obtain yellow-colored solid. The solid was recovered and then dried sufficiently in a vacuum oven at 40° C., to give 2.5 g (57.2% yield) having a melting point of 128–130° C.

$^1$H-NMR (CDCl$_3$): δ 0.86 (br, 3H, CH$_3$), 1.27 (br, 6H, CH$_2$), 1.52 (br, 2H, CH$_2$), 2.26 (s, 6H, CH$_3$), 2.50–2.59 (t,

2H, CH$_2$), 3.83 (s, 3H, —OCH$_3$), 6.24 (s, 1H, pyrrole —CH), 6.80–6.82 (d, 2H, aromatic), 6.95–7.02 (t, 10H, aromatic).

Example 46

Synthesis of N-(p-Tolyl)-2,5-diphenyl-3,4-diphenylpyrrole [M-46]

Under an argon atmosphere, 5.0 g (10 mmol) of [M-5], 3 g (24.6 mmol) of phenylboronic acid and 0.23 g (20 mmol) of tetrakis(triphenylphosphine)palladium(0) were put into a 250 ml round-bottomed flask equipped with a thermometer, reflux condenser and stirrer, and dissolved in 100 ml of toluene. 50 ml of 2M potassium carbonate was added to the resulting solution. The reaction mixture was slowly heated and refluxed for 48 hours. After the reaction was completed, the reaction mixture was cooled down to room temperature and then extracted with toluene several times. The combined extract was washed with water several times and then dried with anhydrous magnesium sulfate. The solvent was then removed to obtain solid, which was recrystallized from methylene chloride/ethanol, to give white solid. The solid was recovered and then dried sufficiently in a vacuum oven at 40° C., to give 1.0 g (20.2% yield) of the desired product having a melting point of 259–260° C.

$^1$H-NMR (CDCl$_3$): δ 2.26 (s, 3H, CH$_3$), 6.80–7.25 (m, 24H, aromatic).

Example 47

Synthesis of N-(p-Tolyl)-2,5-diphenyl-3-methoxypyrrole [M-47]

Under an argon atmosphere, 0.12 g (5 mmol) of sodium was put into a 50 ml 2-necked round-bottomed flask equipped with a reflux condenser and stirrer, into which 2 ml of pure methanol was added. When the sodium was completely dissolved, residual methanol was removed completely under a reduced pressure. 0.5 ml of pure methanol was added to the generated sodium methoxide. 1.3 g (3.32 mmol) of [M-4] and 48 mg (0.33 mmol) of copper(I) bromide were added to the resulting solution, and then 3 ml of dimethylformamide was added thereto. The resulting mixture was reacted at 110° C. for 12 hours. After the reaction was completed, the reaction mixture was cooled down to room temperature, into which water was added, and then organic substances were extracted with chloroform. The organic extract was washed with water sufficiently and dried with anhydrous magnesium sulfate, from which the solvent was removed to obtain solid. The solid was recrystallized from hexane/ethyl acetate to obtain white solid. The solid was recovered and then dried sufficiently in a vacuum oven at 40° C., to give 0.8 g (70.8% yield) of the desired product having a melting point of 157–158° C.

$^1$H-NMR (CDCl$_3$): δ 2.30 (s, 3H, CH$_3$), 3.85 (s, 3H, —OCH$_3$), 6.28 (s, 1H, pyrrole —CH), 6.85–7.15 (m, 14H, aromatic).

Example 48

Synthesis of N-(p-Tolyl)-2,5-diphenyl-3-methoxypyrrole [M-47]—Method 2

Under an argon atmosphere, 0.3 g (12.8 mmol) of sodium is put into a 50 ml 2-necked round-bottomed flask equipped with a reflux condenser and stirrer, into which 3 ml of pure methanol was added, to generate sodium methoxide. When the sodium was completely dissolved, residual methanol was removed completely under a reduced pressure. 0.7 ml of pure methanol was added to the generated sodium methoxide. 2.0 g (4.28 mmol) of [M-5] and 0.06 g (0.43 mmol) of copper(I) bromide were added to the resulting solution, and then 4 ml of dimethylformamide was added thereto. The resulting mixture was reacted at 110° C. for 12 hours. After the reaction was completed, the reaction mixture was cooled down to room temperature, and water was added thereto. Organic substances were extracted with chloroform. The organic extract was washed with water sufficiently and dried with anhydrous magnesium sulfate, and then the solvent was removed to obtain solid. The solid was recrystallized from hexane/ethyl acetate to obtain white solid. The white solid was recovered and then dried sufficiently in a vacuum oven at 40° C., to give 1.1 g (77.8% yield) of the desired product having a melting point of 157–158° C.

$^1$H-NMR (CDCl$_3$): δ 2.30 (s, 3H, CH$_3$), 3.85 (s, 3H, —OCH$_3$), 6.28 (s, 1H, pyrrole —CH), 6.85–7.15 (m, 14H, aromatic).

Example 49

Synthesis of N-(p-Tolyl)-2,5-diphenyl-3,4-dimethoxypyrrole [M-48]—Method 1

Under an argon atmosphere, 0.3 g (12.8 mmol) of sodium is put into a 50 ml 2-necked round-bottomed flask equipped with a reflux condenser and stirrer, into which 3 ml of pure methanol was added, to generate sodium methoxide. When the sodium was completely dissolved, residual methanol was removed completely under a reduced pressure. 0.7 ml of pure methanol was added to the generated sodium methoxide. 2.0 g (4.28 mmol) of [M-5] and 0.12 g (0.856 mmol) of copper(I) bromide were added to the resulting solution, and then 4 ml of 1-methylpyrrolidinone was added thereto. The reaction mixture was then reacted at 110° C. for 12 hours. After the reaction was completed, the reaction mixture was cooled down to room temperature, and then water was added thereto. Organic substances were extracted with chloroform. The organic extract was washed with water sufficiently and dried with anhydrous magnesium sulfate, and then the solvent was removed to obtain solid. The solid was recrystallized from hexane/ethyl acetate to obtain white solid. The white solid was recovered and then dried sufficiently in a vacuum oven at 40° C., to give 0.6 g (37.9% yield) of the desired product having a melting point of 192–193° C.

$^1$H-NMR (CDCl$_3$): δ 2.30 (s, 3H, CH$_3$), 3.85 (s, 3H, —OCH$_3$), 6.28 (s, 1H, pyrrole —CH), 6.85–7.15 (m, 14H, aromatic).

Example 50

Synthesis of N-(p-Tolyl)-2,5-diphenyl-3,4-dimethoxypyrrole [M-48]—Method 2

Under an argon atmosphere, 0.3 g (12.8 mmol) of sodium was put into a 50 ml 2-necked round-bottomed flask equipped with a reflux condenser and stirrer, into which 3 ml of pure methanol was added, to generate sodium methoxide. When the sodium was completely dissolved, residual methanol was removed completely under a reduced pressure. 0.7 ml of pure methanol was added to the generated sodium methoxide. 2.0 g (4.28 mmol) of [M-5], 0.34 g (4.27 mmol) of copper(II) oxide and 7.6 mg (0.045 mmol) of potassium iodide were added to the resulting solution, and then 4 ml of 1-methylpyrrolidinone was added thereto. The reaction mixture was then reacted at 110° C. for 3 days. After 7.6 mg (0.045 mmol) of potassium iodide was added again, the reaction was continued for one more day. After the reaction was completed, the reaction mixture was cooled down to room temperature, and water was added thereto. Organic substances were extracted with chloroform. The organic extract was washed with water sufficiently and dried with anhydrous magnesium sulfate, and then the solvent was removed to obtain solid. The solid was recrystallized from hexane/ethyl acetate to obtain white solid. The white solid was recovered and then dried sufficiently in a vacuum oven at 40° C., to give 0.7 g (44.3% yield) of the desired product having a melting point of 192–193° C.

$^1$H-NMR (CDCl$_3$): δ 2.30 (s, 3H, CH$_3$), 3.85 (s, 3H, —OCH$_3$), 6.28 (s, 1H, pyrrole —CH), 6.85–7.15 (m, 14H, aromatic).

Syntheses of Polymers

Example 51

Polymerization of [M-16]

Under an argon atmosphere, 0.482 g (1.0 mmol) of [M-16], 0.217 g (0.8 mmol) of triphenylphosphine, 0.203 g (3.1 mmol) of zinc, 0.016 g (0.1 mmol) of 2,2'-dipyridine and 0.013 g (0.1 mmol) of nickel(II) chloride were put into a 50 ml round-bottomed flask, into which 5 ml of dimethylformamide was added. The reaction mixture was stirred for 48 hours while maintaining the temperature at 100° C. A small amount of iodobenzene was added to quench the reaction. The reaction mixture was cooled down to room temperature, precipitated in 500 ml of methanol and then filtered to recover the product. The obtained polymer was dissolved in a minimum amount of chloroform, passed through a 1 μm filter and then reprecipitated in methanol. The reprecipitated solid was filtered and then dried under a reduced pressure, to give 0.21 g (66.2%) of pure polymer. The polymer in chloroform has an UV absorption maximum wavelength of 306 nm and a maximum PL wavelength of 424 nm.

$^1$H-NMR (CDCl$_3$): δ 2.32 (3H, —CH$_3$), 6.46 (2H, —CH—), 6.88–7.18 (18H, aromatic).

Example 52

Copolymerization of [M-16] and 9,9'-n-Dihexylfluorene-2,7-diboronic Acid [P-2]

Under an argon atmosphere, 0.47 g (1.0 mmol) of [M-16], 0.44 g (1.0 mmol) of 9.9'-n-dihexyl fluorene-2,7-diboronic acid and 3 mg of tetrakis(triphenylphosphine)palladium(0) were put into a 50 ml round-bottomed flask equipped with a reflux condenser, and dissolved in 10 ml of toluene. 5 ml of 2M sodium carbonate was added to the resulting solution, and the reaction mixture was stirred for 48 hours while maintaining the temperature at 110° C. A small amount of iodobenzene was added to quench the reaction. The reaction mixture was cooled down to room temperature, precipitated in 500 ml of methanol and then filtered to recover the product. The obtained polymer was dissolved in a minimum amount of chloroform, passed through a 1 μm filter and then reprecipitated in methanol. The reprecipitated polymer was filtered and then dried under a reduced pressure, to give 0.63 g (98%) of pure polymer. The polymer in chloroform has an UV absorption maximum wavelength of 370 nm and a maximum PL wavelength of 446 nm.

$^1$H-NMR (CDCl$_3$): δ 0.82–1.35 (m, 22H, —CH$_2$— and —CH$_3$), 1.98–2.20 (m, 4H, —CCH$_2$—), 2.38 (s, 3H, —CH$_3$), 6.66 (s, 2H, —CH—), 6.96–7.88 (m, 18H, aromatic).

Example 53

Copolymerization of [M-17] and 9,9'-n-Dihexylfluorene-2,7-diboronic Acid [P-3]

Under an argon atmosphere, 0.31 g (0.56 mmol) of [M-17], 0.24 g (0.56 mmol) of 9.9'-n-dihexylfluorene-2,7-diboronic acid and 2 mg of tetrakis(triphenylphosphine)palladium(0) were put into a 50 ml round-bottomed flask equipped with a reflux condenser, and dissolved in 10 ml of toluene. 5 ml of 2M sodium carbonate was added to the resulting solution, and the reaction mixture was stirred for 48 hours while maintaining the temperature at 110° C. A small amount of iodobenzene was added to quench the reaction. The reaction mixture was cooled down to room temperature, precipitated in 500 ml of methanol and then filtered to recover the product. The obtained polymer was dissolved in a minimum amount of chloroform, passed through a 1 μm filter and then reprecipitated in methanol. The reprecipitated polymer was filtered and then dried under a reduced pressure, to give 0.26 g (65%) of pure polymer. The product in chloroform has an UV absorption maximum wavelength of 370 nm and a maximum PL wavelength of 444 nm.

$^1$H-NMR (CDCl$_3$): δ 0.75–2.15 (37H, —CCH$_2$—, —CH$_2$— and —CH$_3$), 3.95 (2H, —OCH$_2$—), 6.57 (2H, —CH—), 6.83–7.78 (m, 18H, aromatic).

Example 54

Co-polymerization of [M-18] and 1,4-Benzenediboronic acid [P-4]

Under an argon atmosphere, 0.337 g (0.6 mmol) of [M-18], 0.109 g (0.6 mmol) of 1,4-benzenediboronic acid and 1 mg of tetrakis(triphenylphosphine)palladium(0) were put into a 50 ml round-bottomed flask equipped with a reflux condenser, and dissolved in 10 ml of toluene. 5 ml of 2M sodium carbonate was added to the resulting solution, and the reaction mixture was stirred for 48 hours while maintaining the temperature at 110° C. A small amount of iodobenzene was added to quench the reaction. The reaction mixture was cooled down to room temperature, precipitated in 500 ml of methanol and then filtered to recover the product. The obtained polymer was dissolved in a minimum amount of chloroform, passed through a 1 μm filter and then reprecipitated in methanol. The reprecipitated polymer was filtered and then dried under a reduced pressure, to give 0.14 g (49.3%) of pure polymer. The product in chloroform has an UV Is absorption maximum wavelength of 314 nm and a maximum PL wavelength of 392 nm.

$^1$H-NMR (CDCl$_3$): δ 0.94 (3H, —CH$_3$—), 1.30–1.85 (8H, —CH$_2$—), 2.65 (2H, —CCH$_2$—), 6.50 (2H, —CH—), 6.9–7.38 (16H, aromatic).

Example 55

Co-polymerization of [M-16] and Divinylbenzene [P-5]

Under an argon atmosphere, 0.49 g (1.0 mmol) of [M-16], 0.32 g (3.1 mmol) of triethylamine, 12 mg (0.05 mmol) of paladium(II) acetate and 0.01 g (0.3 mmol) of tri-o-tolylphosphine were put into a 50 ml round-bottomed flask, and dissolved in 10 ml of dimethylformamide. 0.14 g (1.0 mmol) of divinylbenzene was added to the resulting solution, and the reaction mixture was reacted at 100° C. for 24 hours. The reaction mixture was cooled down to room temperature, precipitated in 500 ml of methanol and then filtered to recover the precipitated product. The obtained polymer was dissolved in a minimum amount of chloroform, passed through a 1 μm filter and then reprecipitated in methanol. The reprecipitated polymer was filtered and then dried under a reduced pressure, to give 0.2 g (43.8%) of pure polymer. The polymer in chloroform has an UV absorption maximum wavelength of 316 nm and a maximum PL wavelength of 460 nm.

$^1$H-NMR (CDCl$_3$): δ 2.33 (3H, —CH$_3$), 6.45 (2H, —CH—), 6.84–7.42 (20H, aromatic and vinyl).

Example 56

Examination of Ultraviolet-visible Absorption, PL and EL Properties

Figure 2:
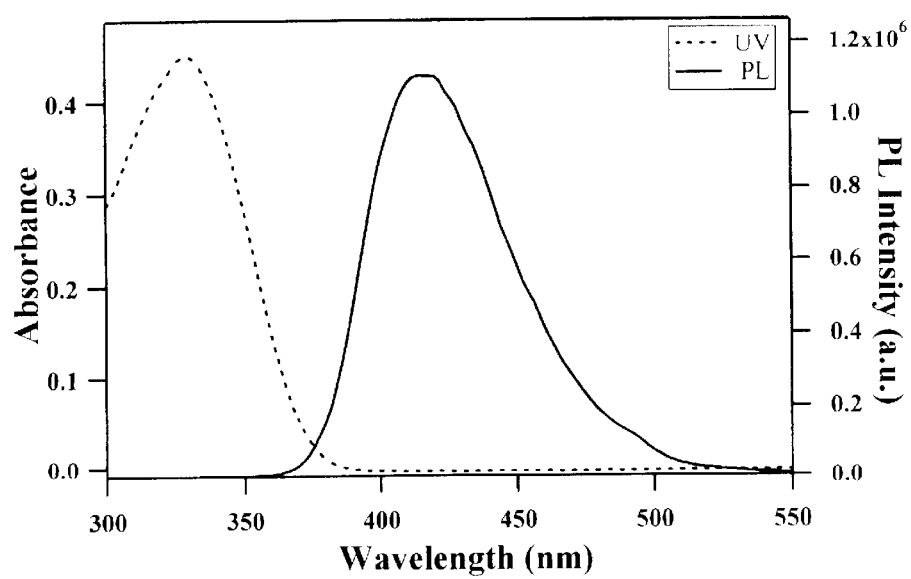
Figure 3:
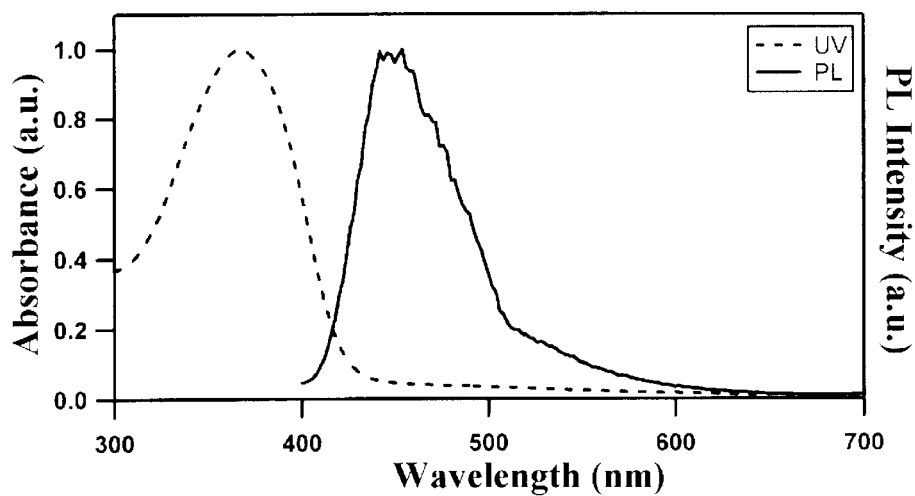
Figure 4:
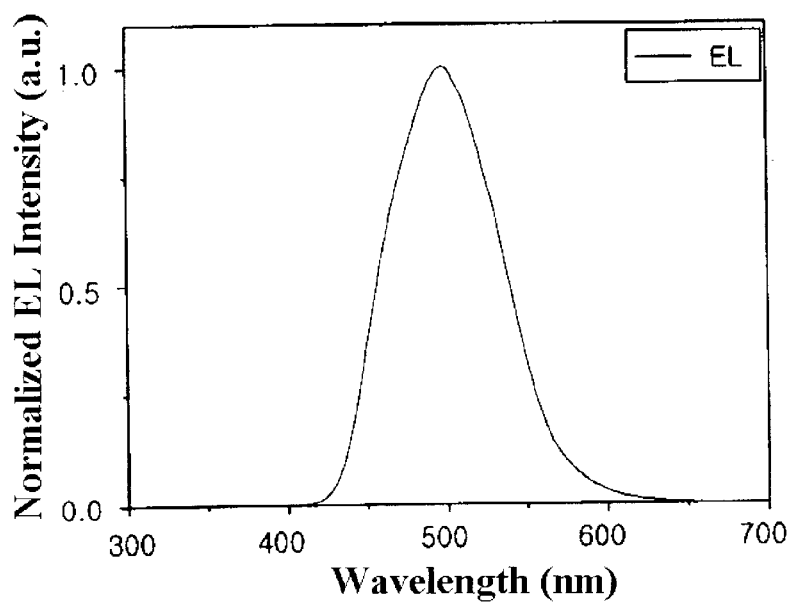
Figure 5:
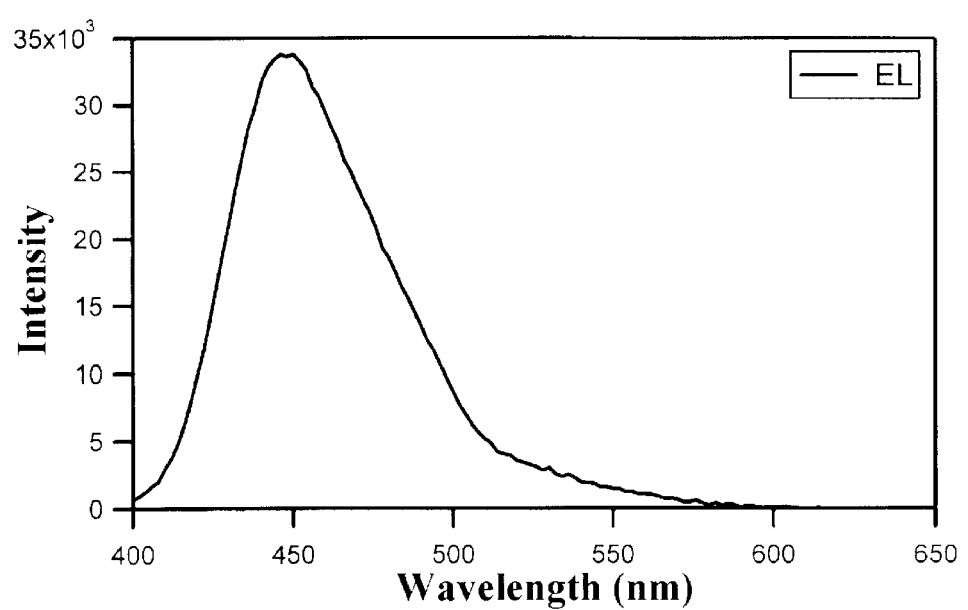

FIG. 1 shows $^1$H NMR spectrum of the monomer [M-16] prepared in Example 16. FIGS. 2 and 3 show an ultraviolet-visible (referred to as 'UV-Vis', hereinafter) and PL spectra of the monomer [M-32] prepared in Example 32 and the polymer [P-3] prepared in Example 53. FIG. 4 shows an EL spectrum of the monomer [M-24] prepared in Example 24, of which the EL element was constructed in the structure of ITO/CuPc/M-24/Alq3/LiF/Al. FIG. 5 shows an EL spectrum of the polymer [P-3] prepared in Example 53, of which the EL element was constructed in the structure of ITO/PVK:P-3=8:2/Al.

UV-Vis and PL properties were examined as follows:

0.1 g of polymer [P-3] was dissolved in 5 ml of chloroform. The resulting solution was filtered through a micro filter of 0.2 micron in size and then spin-coated in order to prepare a polymer thin film, while adjusting the spinning rate so as the polymer thin film to have a thickness of about 100 nm. After the resulting polymer thin film was dried at room temperature, its UV-Vis spectrum was observed, and then a PL spectrum was observed at a wavelength where the UV-Vis spectrum exhibited a maximum value.

Next, a most generally used EL element consisting of ITO/light-emitting layer/electrode was fabricated, and then its EL property was observed.

As the light-emitting layer, a polymer prepared in Examples as described above, or a material in which a polymer of the present invention was blended with a commonly used polymer, for example, polyvinylcarbazole, polymethylmethacrylate, polystyrene, an epoxy resin or the like, in chloroform was used. Aluminum was used as the electrode. The EL element was prepared in the same manner as in preparing the polymer thin film for observing UV-Vis or the PL spectrum. That is, the light-emitting layer was spin-coated onto an ITO glass substrate at a thickness of 100 nm, and then aluminum was vacuum-deposited onto the light-emitting layer. FIG. 5 shows an EL spectrum of the EL element comprising a material in which the polymer [P-3] was blended with polyvinylcarbazole.

Tables 1a–1d shows structures and EL properties of the pyrrole group monomers and polymers thereof which can be included in the scope of the present invention.

TABLE 1
| 번호 | 구조 | 구조식 (분자량) | UV (CHCl₃) $\lambda_{max}$ (nm) | PL (CHCl₃) $\lambda_{max}$ (nm) | M.P. (° C.) |
|---|---|---|---|---|---|
| [M-4] | 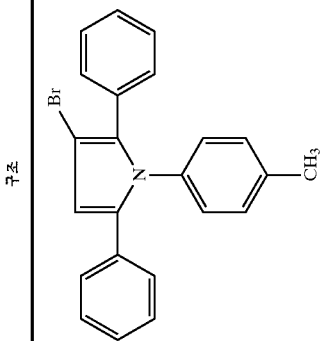 | $C_{23}H_{18}BrN$ (388.30) | 298 | 370 | 201–202 |
| [M-5] | 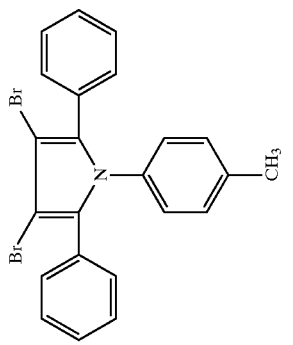 | $C_{23}H_{17}Br_2N$ (467.20) | 288 | 368 | 227–228 |
| [M-6] | 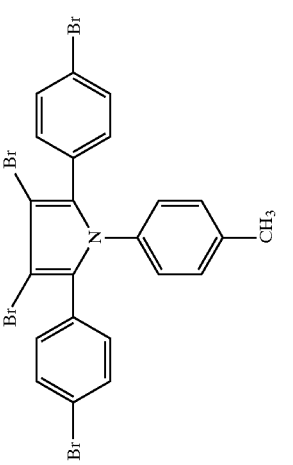 | $C_{23}H_{15}Br_4N$ (624.99) | 298 | 367 | 240–242 |

TABLE 1-continued

| 번호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [M-7] | (structure with COC$_7$H$_{15}$, N-tolyl, diphenyl pyrrole) | C$_{31}$H$_{33}$NO (435.60) | 280 | 418 | — |
| [M-8] | (structure with two COC$_7$H$_{15}$ groups, N-tolyl, diphenyl pyrrole) | C$_{39}$H$_{47}$NO$_2$ (561.80) | 280 | 414 | 51–53 |
| [M-9] | (structure with two C$_8$H$_{17}$ groups, N-tolyl, diphenyl pyrrole) | C$_{39}$H$_{51}$N (533.83) | 274 | 450 | 100–101 |

TABLE 1-continued

| 번호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [M-10] | (pyrrole with C$_8$H$_{17}$, two phenyl groups, and N-tolyl) | C$_{31}$H$_{35}$N (421.62) | 280 | 450 | — |
| [M-11] | (pyrrole with C$_6$H$_{13}$, two phenyl groups, and N-tolyl) | C$_{29}$H$_{31}$N (393.56) | 302 | 374 | — |
| [M-12] | (pyrrole with C$_6$H$_{13}$, Br, two phenyl groups, and N-tolyl) | C$_{29}$H$_{30}$BrN (472.46) | 296 | 382 | 86–89 |

TABLE 1-continued

| 번호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [M-13] | | C$_{22}$H$_{18}$BrN (374.27) | 300 | 390 | 218–219 |
| [M-14] | | C$_{27}$H$_{25}$NSi (391.58) | 282 | 366 | 183–184 |
| [M-15] | | C$_{24}$H$_{17}$N (319.40) | 298 | 384 | 208–209 |

TABLE 1-continued
| 번호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [M-16] | 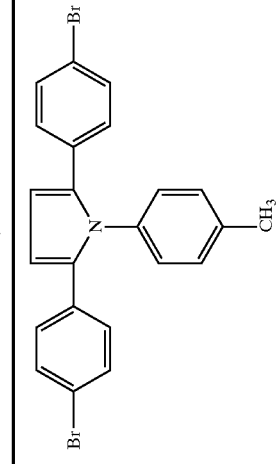 | C$_{23}$H$_{17}$Br$_2$N (467.20) | 317 | 388 | 262–264 |
| [M-17] | 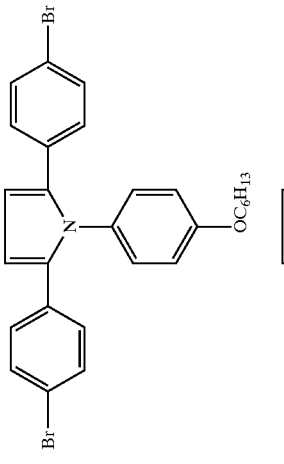 | C$_{28}$H$_{27}$Br$_2$NO (553.33) | 317 | 386 | 201–202 |
| [M-18] | 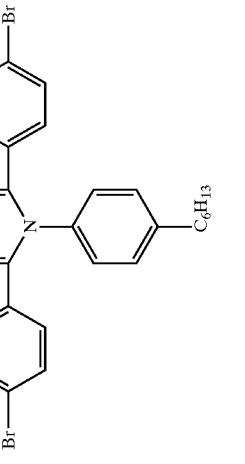 | C$_{28}$H$_{27}$Br$_2$N (537.33) | 314 | 388 | 198–199 |

TABLE 1-continued
| 번호 | 구조 | 구조식 (분자량) | UV (CHCl₃) $\lambda_{max}$ (nm) | PL (CHCl₃) $\lambda_{max}$ (nm) | M.P. (°C.) |
|---|---|---|---|---|---|
| [M-19] | 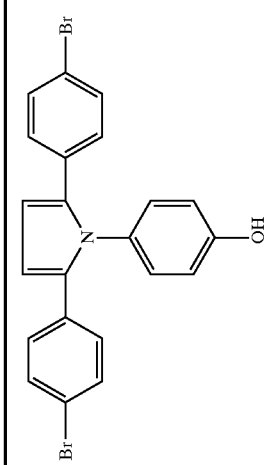 | $C_{22}H_{15}Br_2NO$ (469.17) | 318 | 388 | 284–285 |
| [M-20] | 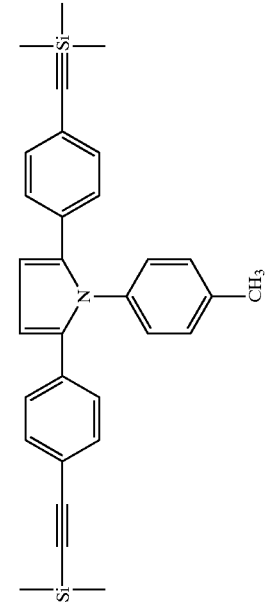 | $C_{33}H_{35}NSi_2$ (501.81) | 333 | 435 | 223–224 |
| [M-21] | 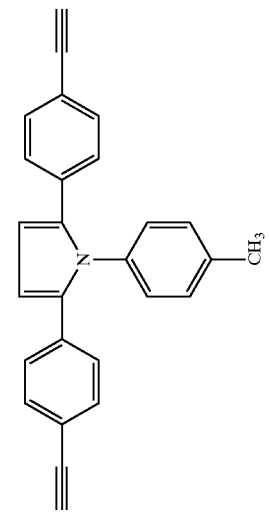 | $C_{27}H_{19}N$ (357.45) | 333 | 407 | 235–237 |

TABLE 1-continued
| 번호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [M-22] | 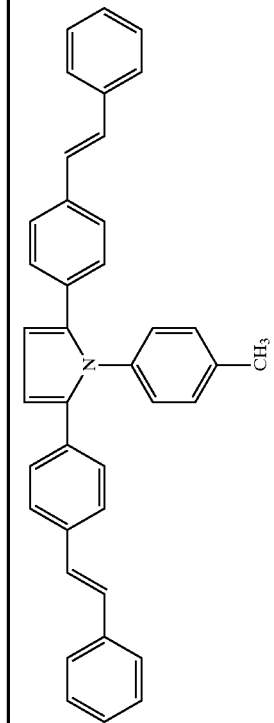 | C$_{39}$H$_{31}$N (513.67) | 368 | 454 | 297–298 |
| [M-23] | 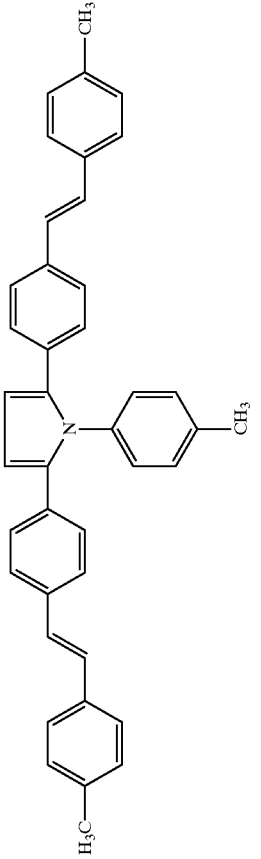 | C$_{41}$H$_{35}$N (541.72) | 368 | 456 | 314–316 |
| [M-24] | 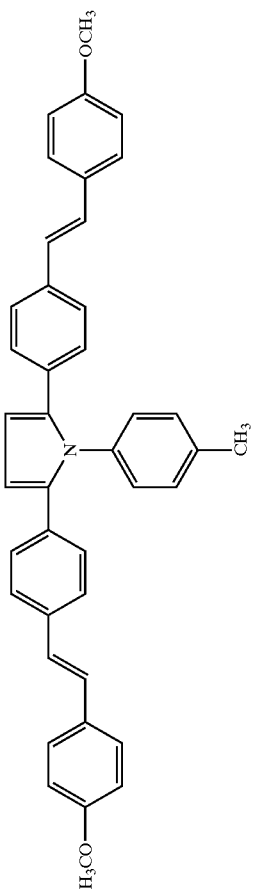 | C$_{41}$H$_{35}$NO$_2$ (573.72) | 368 | 454 | 303–305 |

TABLE 1-continued

| 연호 | 구조 | 구조식 (분자량) | UV (CHCl$_3$) $\lambda_{max}$ (nm) | PL (CHCl$_3$) $\lambda_{max}$ (nm) | M.P. (°C.) |
|---|---|---|---|---|---|
| [M-28] | | C$_{39}$H$_{27}$N (509.64) | 390 | 464 | 262–263 |
| [M-32] | | C$_{31}$H$_{23}$N (409.52) | 330 | 416 | 105–106 |
| [M-36] | | C$_{27}$H$_{23}$NO$_4$ (425.48) | 352 | 418 | 193–195 |

TABLE 1-continued

| 번호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [M-37] | | C$_{32}$H$_{33}$NO$_4$ (495.61) | 350 | 420 | 129–130 |
| [M-41] | | C$_{30}$H$_{33}$N (407.59) | 306 | 385 | 147–148 |
| [M-42] | | C$_{24}$H$_{21}$NO (339.43) | 304 | 386 | 221–222 |

TABLE 1-continued

| 번호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [M-43] | | C$_{30}$H$_{31}$Br$_2$N (565.38) | 290 | 370 | 130–132 |
| [M-44] | | C$_{30}$H$_{32}$BrN (486.49) | 298 | 376 | 134–135 |
| [M-45] | | C$_{31}$H$_{35}$NO (437.62) | 314 | 387 | 128–130 |

TABLE 1-continued

| 번호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [M-46] | | C$_{35}$H$_{27}$N (461.60) | 262, 292 | 382 | 259–260 |
| [M-47] | | C$_{24}$H$_{21}$NO (339.43) | 316 | 391 | 157–158 |
| [M-48] | | C$_{25}$H$_{23}$NO$_2$ (369.17) | 310 | 386 | 192–193 |

TABLE 1-continued
| 연호 | 구조 | 구조식 (분자량) | UV (CHCl$_3$) $\lambda_{max}$ (nm) | PL (CHCl$_3$) $\lambda_{max}$ (nm) | M.P. (° C.) |
|---|---|---|---|---|---|
| [P-1] | 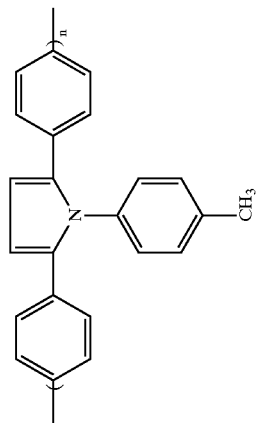 | — | 306 | 424 | — |
| [P-2] | 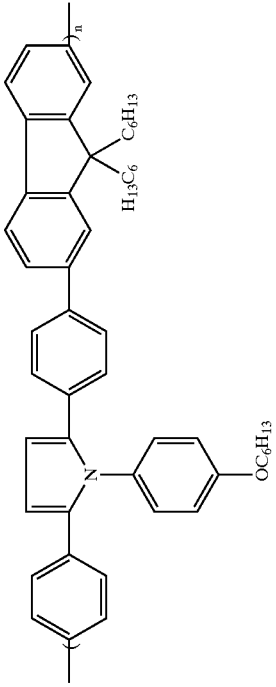 | — | 370 | 446 | — |
| [P-3] | 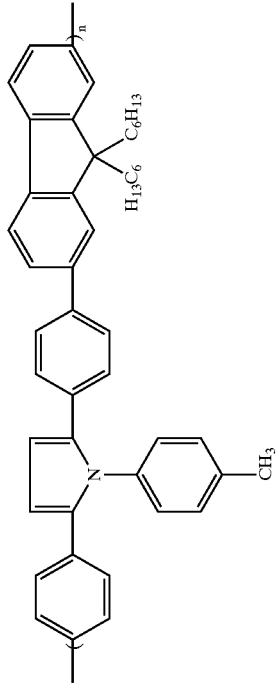 | — | 370 | 444 | — |

TABLE 1-continued
| 번호 | 구조 | 구조식 (분자량) | UV (CHCl$_3$) $\lambda_{max}$ (nm) | PL (CHCl$_3$) $\lambda_{max}$ (nm) | M.P. (°C.) |
|---|---|---|---|---|---|
| [P-4] | 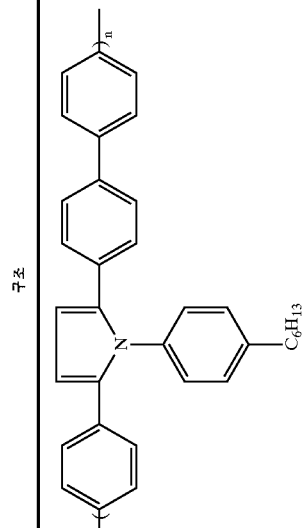 | — | 314 | 392 | — |
| [P-5] | 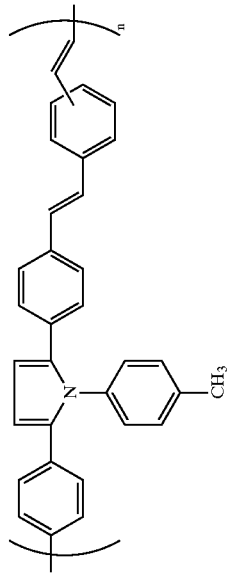 | — | 316 | 460 | — |

As so far described, a pyrrole compound, polymers thereof and EL element using the same as a core material were provided in the present invention. Due to its excellent light-emitting and transporting properties, the pyrrole compounds and polymers thereof can be used as a material for an organic and polymeric EL element. In addition, as the pyrrole compounds and polymers thereof according to the present invention have optical and electrical activities, they are expected to be applied to an optical switch, sensor, module, waveguide, organic transistor, laser, light-absorbing body, dielectric substance, membrane and the like.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A pyrrole group polymer represented by the following chemical formula:

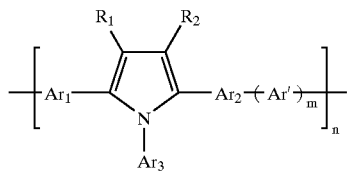

wherein, $R_1$ and $R_2$ are the same or different substituents independently selected from the group consisting of hydrogen, $C_1$–$C_{22}$ aliphatic alkyl, $C_1$–$C_{22}$ alicyclic alkyl, $C_1$–$C_{22}$ acyl, $C_1$–$C_{22}$ alkoxy, $C_6$–$C_{30}$ aryl, $C_6$–$C_{30}$ aryloxy, halogen containing substituent, silicon containing substituent, organic acid and organic acid ester;

$Ar_1$, $Ar_2$ and $Ar_3$ are the same or different substituents independently selected from the group consisting of $C_6$–$C_{30}$ aromatic groups which are not substituted or substituted with halogen, metal or hetero atom;

Ar' represents a substituent selected from the group consisting of aromatic and heterocyclic groups including phenyl, naphthyl, anthracenyl, fluorenyl, thiophenyl, pyrrolyl, pyridinyl, aryloxadiazolyl, triazolyl, carbazolyl, arylamino, arylsilano and derivatives thereof; and m is 0 or an integer of above 1, and n is an integer of above 1.

2. The polymer according to claim 1, wherein $R_1$ and $R_2$ are independently selected from the group consisting of hydrogen, methyl, ethyl, propyl, isopropyl, butyl, isobutyl, pentyl, hexyl, ethylhexyl, heptyl, octyl, isooctyl, nonyl, decyl, dodecyl, hexadecyl, octadecyl, docodecyl, cyclopropyl, cyclopentyl, cyclohexyl, acetyl, octanoyl, benzoyl, methoxy, ethoxy, ethylenedioxy, buthoxy, hexyloxy, methoxyethoxyethyl, methoxyethoxyethoxyethyl, cyanoethyl, carboxymethyl, phenyl, phenoxy, tolyl, benzyl, naphthyl, anthracenyl, terphenyl, pyrenyl, diphenylanthracenyl, pentacenyl and derivatives thereof, chiroride, bromide, iodide, bromomethyl, trimethylsilyl, dimethyloctylsilyl, and butylsulfonic acid, propionic acid and methyl esters thereof;

$Ar_1$, $Ar_2$ and $Ar_3$ are independently selected from the group consisting of phenyl, tolyl, naphthyl, stilbenyl, fluorenyl, anthracenyl, terphenyl, pyrenyl, diphenylanthracenyl, dinaphthyl anthracenyl, pentacenyl and derivatives thereof, bromophenyl, hydroxyphenyl, thienyl, pyridyl, azobenzenyl, ferrocenyl, carbazoyl, porphyrin and derivatives thereof; and Ar' is selected from the group consisting of phenyl, naphthyl, anthracenyl, fluorenyl, thiopenyl, pyrrolyl, pyridinyl, aryloxadiazolyl, triazolyl, carbazolyl, arylamino, arylsilano and derivatives thereof.

3. The polymer according to claim 1, wherein n is an integer of 1–1000.

4. The polymer according to claim 1, wherein Ar' is selected from the group represented by the following chemical formulae:

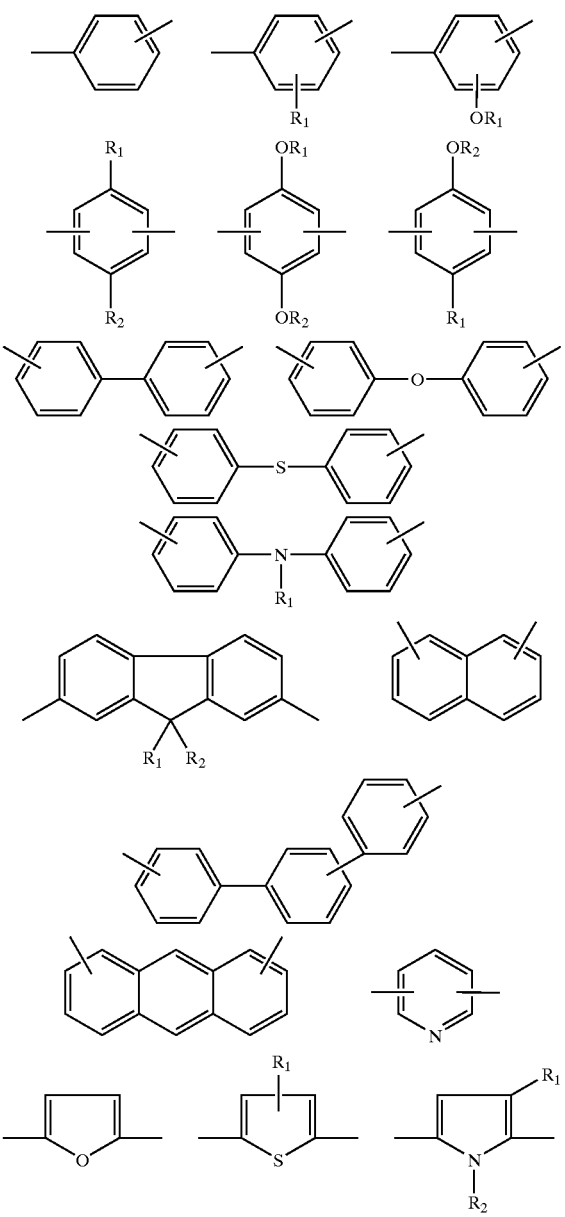

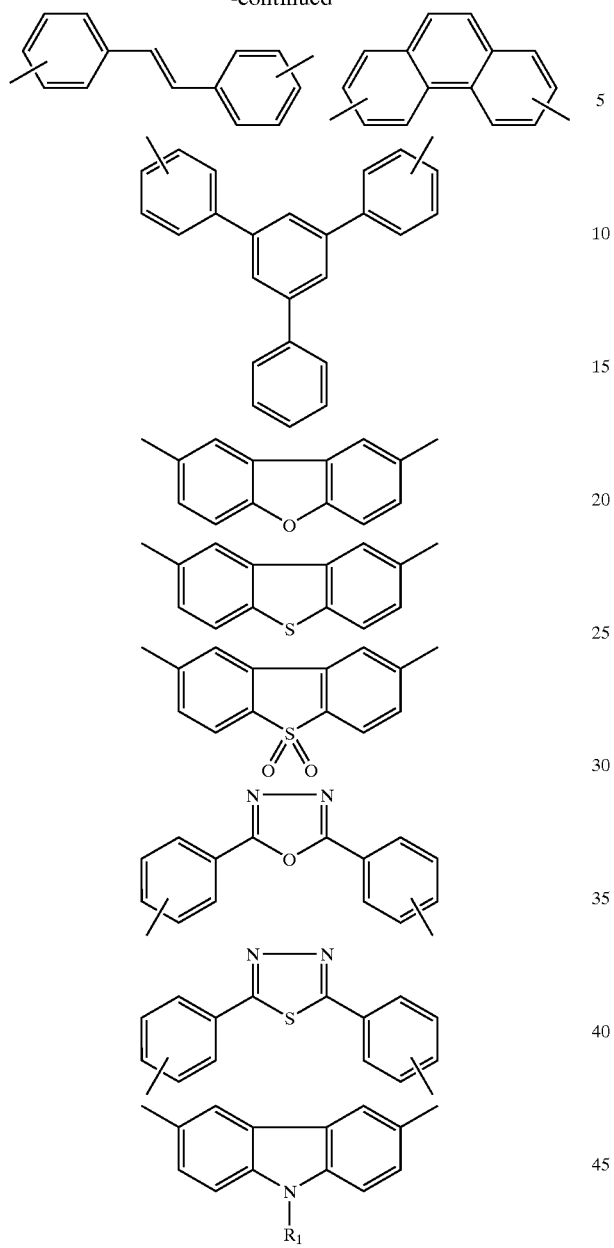
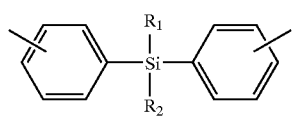
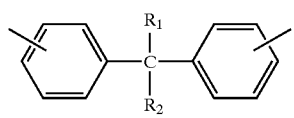
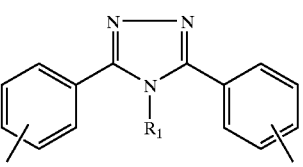
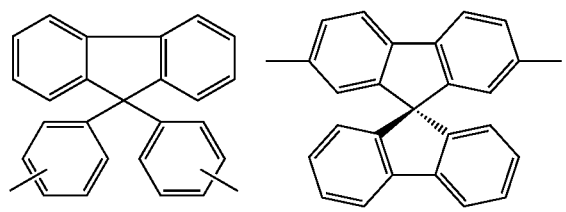
5. The polymer according to claim 1, having the same or different repeat unit which is represented by the following formula:
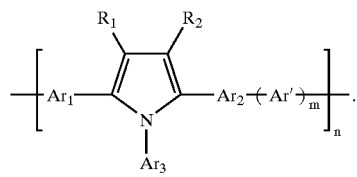
6. The polymer according to claim 1, which is used as a core material for an organic polymer semiconductor, or organic or polymeric EL element.
* * * * *